(12) United States Patent
Ozeki et al.

(10) Patent No.: US 11,616,179 B2
(45) Date of Patent: Mar. 28, 2023

(54) LIGHT EMITTING DEVICE AND METHOD OF MANUFACTURING LIGHT EMITTING DEVICE

(71) Applicant: NICHIA CORPORATION, Anan (JP)

(72) Inventors: Kenji Ozeki, Tokushima (JP); Atsushi Kojima, Tokushima (JP); Chinami Nakai, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/513,254

(22) Filed: Oct. 28, 2021

(65) Prior Publication Data

US 2022/0052238 A1     Feb. 17, 2022

Related U.S. Application Data

(63) Continuation of application No. 16/726,394, filed on Dec. 24, 2019, now Pat. No. 11,189,765.

(30) Foreign Application Priority Data

Dec. 28, 2018   (JP) .............................. JP2018-248307

(51) Int. Cl.
*H01L 33/60*     (2010.01)
*H01L 33/48*     (2010.01)
(Continued)

(52) U.S. Cl.
CPC ............ *H01L 33/60* (2013.01); *H01L 25/167* (2013.01); *H01L 29/866* (2013.01);
(Continued)

(58) Field of Classification Search
CPC ..... H01L 33/60; H01L 25/167; H01L 29/866; H01L 33/486; H01L 33/502; H01L 33/56;
(Continued)

(56) References Cited

U.S. PATENT DOCUMENTS

2008/0054287 A1   3/2008   Oshio et al.
2008/0149960 A1*   6/2008   Amo .................... H01L 33/505
                                                          257/E33.061
(Continued)

FOREIGN PATENT DOCUMENTS

EP     2 709 175 A1     3/2014
EP     3 444 856 A1     2/2019
(Continued)

OTHER PUBLICATIONS

Notice of Allowance on U.S. Appl. No. 16/726,394 dated Aug. 11, 2021.
(Continued)

*Primary Examiner* — Jonathan Han
(74) *Attorney, Agent, or Firm* — Foley & Lardner LLP

(57) ABSTRACT

A method of manufacturing a light emitting device that comprises a first cover member and a second cover member, includes: providing a package that comprises a substrate, a plurality of resin walls, and a recessed part defined by an upper surface of the substrate and lateral surfaces of the plurality of resin walls, wherein the substrate includes a grooved part surrounding a first region; mounting a light emitting element in the first region; forming the second cover member in a region between the lateral surfaces defining the recessed part to an upper edge of an outer perimeter of the grooved part; forming the first cover member, which comprises depositing an uncured resin on the second cover member, and allowing the uncured resin to flow into a groove of the grooved part; and forming a light transmitting member on the first cover member and the light emitting element.

20 Claims, 13 Drawing Sheets

(51) Int. Cl.
  *H01L 33/50* (2010.01)
  *H01L 33/56* (2010.01)
  *H01L 25/16* (2006.01)
  *H01L 29/866* (2006.01)
  *H01L 33/62* (2010.01)

(52) U.S. Cl.
  CPC .......... *H01L 33/486* (2013.01); *H01L 33/502* (2013.01); *H01L 33/56* (2013.01); *H01L 33/62* (2013.01); *H01L 2933/005* (2013.01); *H01L 2933/0041* (2013.01); *H01L 2933/0058* (2013.01); *H01L 2933/0066* (2013.01)

(58) Field of Classification Search
  CPC ............. H01L 33/62; H01L 2933/0041; H01L 2933/005; H01L 2933/0058; H01L 2933/0066; H01L 2224/48247; H01L 2224/8592; H01L 33/58; H01L 33/20; H01L 33/44; H01L 33/50; H01L 33/54
  See application file for complete search history.

(56) References Cited

U.S. PATENT DOCUMENTS

| | | | |
|---|---|---|---|
| 2010/0102347 A1 | 4/2010 | Oyamada | |
| 2010/0193822 A1 | 8/2010 | Inobe et al. | |
| 2011/0116271 A1 | 5/2011 | Ide et al. | |
| 2013/0037842 A1 | 2/2013 | Yamada et al. | |
| 2013/0169149 A1* | 7/2013 | Sato | H01L 33/54 |
| | | | 313/512 |
| 2013/0183787 A1 | 7/2013 | Inobe et al. | |
| 2013/0187188 A1* | 7/2013 | Sasaoka | H05K 1/0313 |
| | | | 174/255 |
| 2013/0188381 A1 | 7/2013 | Kotani | |
| 2014/0048834 A1 | 2/2014 | Sato et al. | |
| 2015/0034992 A1 | 2/2015 | Inobe et al. | |
| 2015/0155447 A1 | 6/2015 | Beppu | |
| 2015/0187838 A1 | 7/2015 | Kawano | |
| 2016/0035952 A1 | 2/2016 | Yamada et al. | |
| 2016/0155911 A1* | 6/2016 | Abe | H01L 33/54 |
| | | | 438/26 |
| 2016/0197249 A1 | 7/2016 | Sato et al. | |
| 2016/0268481 A1 | 9/2016 | Beppu | |
| 2016/0380160 A1 | 12/2016 | Beppu | |
| 2017/0054061 A1* | 2/2017 | Naka | H01L 33/62 |
| 2017/0062682 A1 | 3/2017 | Inobe et al. | |
| 2017/0213944 A1* | 7/2017 | Naka | H01L 33/60 |
| 2018/0083169 A1 | 3/2018 | Naka et al. | |
| 2018/0123006 A1 | 5/2018 | Yamada et al. | |
| 2019/0019926 A1 | 1/2019 | Lee et al. | |
| 2019/0081217 A1 | 3/2019 | Beppu | |
| 2019/0088837 A1 | 3/2019 | Lee et al. | |
| 2019/0252583 A1 | 8/2019 | Inobe et al. | |

FOREIGN PATENT DOCUMENTS

| | | |
|---|---|---|
| JP | 2008-060344 A | 3/2008 |
| JP | 2010-103294 A | 5/2010 |
| JP | 2010-199547 A | 9/2010 |
| JP | 2011-129876 A | 6/2011 |
| JP | 2012-089539 A | 5/2012 |
| JP | 2012-094689 A | 5/2012 |
| JP | 2013-138148 A | 7/2013 |
| JP | 2013-149906 A | 8/2013 |
| JP | 2014-072415 A | 4/2014 |
| JP | 2014-093311 A | 5/2014 |
| JP | 2014-158011 A | 8/2014 |
| JP | 2015-128121 A | 7/2015 |
| JP | 2015-154007 A | 8/2015 |
| JP | 2015-225942 A | 12/2015 |
| JP | 2016-029686 A | 3/2016 |
| JP | 2016-072412 A | 5/2016 |
| JP | 2017-204623 A | 11/2017 |
| JP | 2019-021919 A | 2/2019 |
| WO | WO-2011/099384 A1 | 8/2011 |
| WO | WO-2012/029695 A1 | 3/2012 |
| WO | WO-2012/147608 A1 | 11/2012 |

OTHER PUBLICATIONS

U.S. Office Action on U.S. Appl. No. 16/726,394 dated May 12, 2021.

* cited by examiner

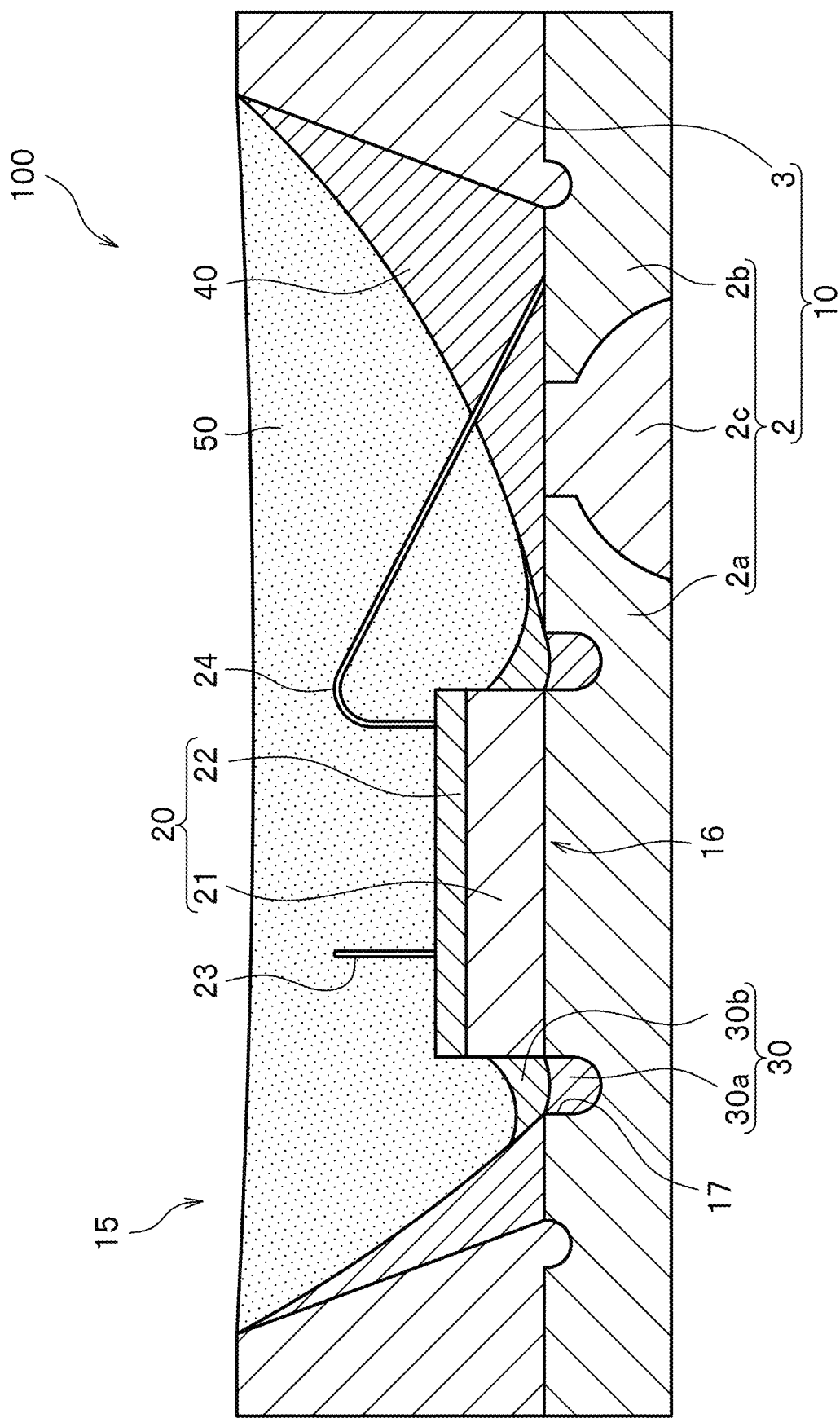

LIGHT EMITTING DEVICE AND METHOD OF MANUFACTURING LIGHT EMITTING DEVICE

CROSS-REFERENCE TO RELATED APPLICATIONS

The present application is a continuation of U.S. patent application Ser. No. 16/726,394, filed on Dec. 24, 2019, which claims priority to Japanese Patent Application No. 2018-248307, filed on Dec. 28, 2018, the disclosures of which are hereby incorporated by reference in their entireties.

BACKGROUND

The present disclosure relates to a light emitting device and a method of manufacturing the same.

A light emitting device having a light emitting element mounted on a substrate has been known. For example, Japanese Patent Publication No. 2017-204623 discloses a light emitting device that includes: a package having a recessed part defined by lateral surfaces and a bottom surface and including a linear or dotted grooved part surrounding an element mounting region provided in the bottom surface, spaced apart from the lateral surfaces; a light emitting element mounted in the element mounting region; a light transmitting resin covering the light emitting element and being in contact with the inner surface of the grooved part; and a light reflecting resin continuously formed from the lateral surfaces of the recessed part to the upper edge of the outer perimeter of the grooved part.

SUMMARY

The technology disclosed in the patent publication mentioned above has room for improvement in efficiency of the light emission.

One object of the present disclosure is to provide a light emitting device having high light emission efficiency and a method of manufacturing light emitting device.

A light emitting device according to certain embodiment of the present disclosure includes: a substrate including a grooved part surrounding a first region; a light emitting element mounted in the first region; a first cover member disposed in a groove of the grooved part and covering at least a portion of the lateral surfaces of the light emitting element; and a light transmitting member disposed on the first cover member and the light emitting element. The first cover member includes a reflecting material-containing layer containing a first reflecting material disposed in the groove of the grooved part, and a light transmitting layer covering at least a portion of the lateral surfaces of the light emitting element.

A method of manufacturing a light emitting device according to certain embodiment of the present disclosure includes: providing a substrate that includes a grooved part surrounding a first region; mounting a light emitting element in the first region; forming a first resin in a groove of the grooved part, the first resin containing a first reflecting material; forming a first cover member that include a reflecting material-containing layer and a light transmitting layer by applying centrifugal force, the reflecting material-containing layer formed in the groove of the grooved part being obtained by settling a first reflecting material in a first resin, and the light transmitting layer covering at least a portion of lateral surfaces of the light emitting element; forming a light transmitting member on the first cover member and the light emitting element.

A light emitting device according to certain embodiment of the present disclosure can increase the light emission efficiency.

A method of manufacturing a light emitting device according to certain embodiment of the present disclosure may manufacture a light emitting device having high light emission efficiency.

BRIEF DESCRIPTION OF THE DRAWINGS

FIG. 1C is a schematic cross-sectional view taken along line IC-IC in FIG. 1A.

DESCRIPTION

Certain embodiments of the present invention will be explained below with reference to the drawings. The light emitting devices and the methods for manufacturing light emitting devices described below are provided as examples to give shape to the technical ideas of the present invention. The present invention is not intended to be limited to the embodiments described below. The sizes, materials, shapes, and relative positions of the constituent elements and parts described in each embodiment are merely provided for illustration purposes, and are not intended to limit the scope of the present invention unless otherwise specifically noted. The sizes of and the positional relationship between the members shown in each drawing might be exaggerated for clarity of explanation.

EMBODIMENTS

Light Emitting Device

Figure 1A:
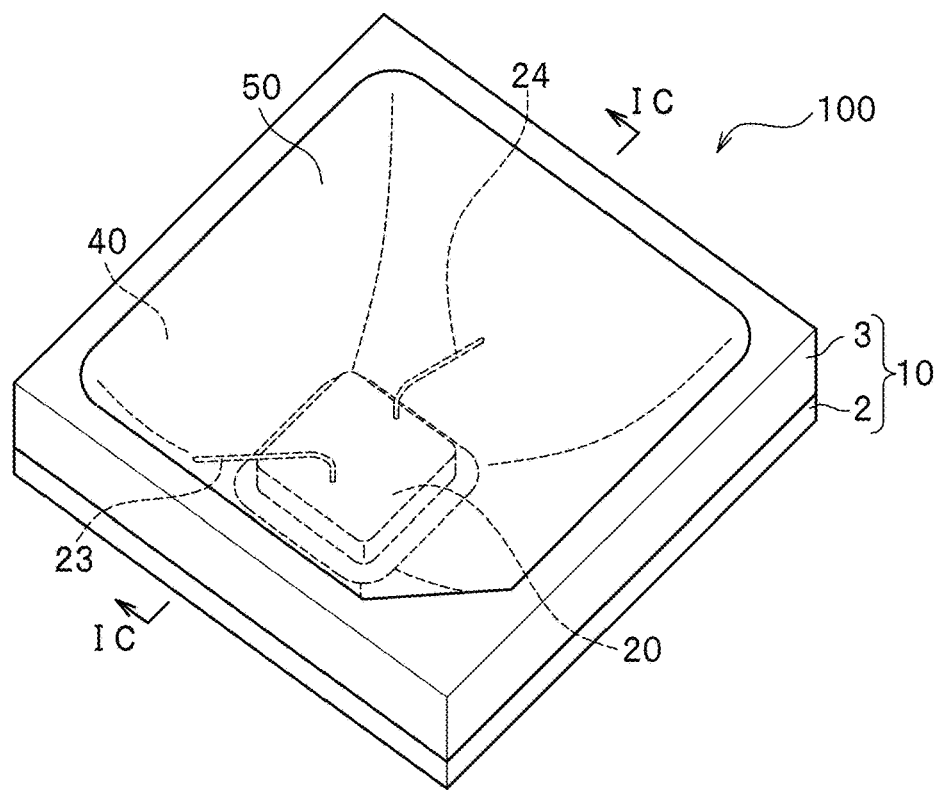
FIG. 1A is a schematic perspective view of a light emitting device according to certain embodiment.
Figure 1B:
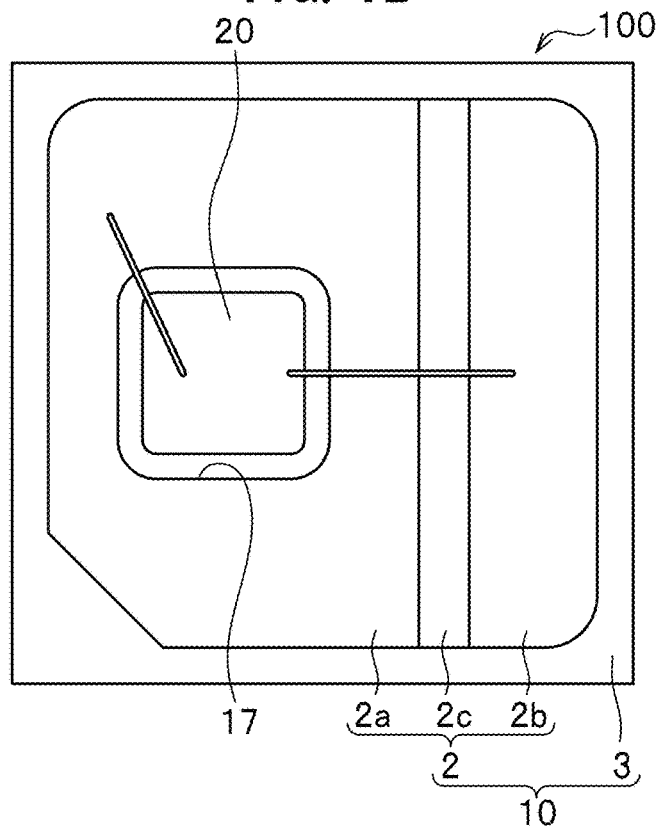
FIG. 1B is a schematic top view of the light emitting device according to the embodiment, in which certain concealed parts are made visible.

FIG. 1A is a schematic perspective view of a light emitting device according to certain embodiment. FIG. 1B is a schematic top view of the light emitting device, in which certain parts are made visible. FIG. 1C is a cross-sectional view taken along line IC-IC in FIG. 1A.

The light emitting device 100 includes a substrate 2 having a grooved part 17 that surrounds a first region, a light emitting element 20 mounted in the first region, a first cover member 30 disposed in the groove of the grooved part 17 and covering at least a portion of the lateral surfaces of the light emitting element 20, and a light transmitting member 50 disposed on the first cover member 30 and the light emitting element 20. In the light emitting device 100, furthermore, the first cover member 30 includes a reflecting material-containing layer 30a containing a first reflecting material disposed in the groove of the grooved part 17 and a light transmitting layer 30b covering at least a portion of the lateral surfaces of the light emitting element 20.

In other words, the light emitting device 100 comprises: a package 10 that includes a substrate 2; a light emitting element 20; a first cover member 30; a second cover member 40; and a light transmitting member 50.

Each constituent element of the light emitting device 100 will be explained below.

The package 10 has a recessed part 15 structured with a bottom surface composed of the substrate 2 and lateral surfaces composed of resin walls 3. The opening of the recessed part 15 is, for example, substantially quadrilateral having a corner shaped different from the other corners in a top view.

The substrate 2 includes a pair of lead electrodes configured as a first lead electrode 2a and a second lead electrode 2b, and a resin molded part 2c that supports the first lead electrode 2a and the second lead electrode 2b.

The first lead electrode 2a is exposed at the bottom surface of the recessed part 15 and connected to the light emitting element 20 and a wire 23. The second lead electrode 2b is exposed at the bottom surface of the recessed part 15 and connected to a wire 24.

The first lead electrode 2a has a grooved part 17 that surrounds a first region 16 where a light emitting element 20 is mounted. The grooved part 17 here is formed such that the parts immediately under the lateral surfaces of the light emitting element 20 are positioned at upper edge of the inner perimeter the grooved part 17. In other words, the grooved part 17 is formed along the outer lateral surfaces of the light emitting element 20. The grooved part 17 here has a square annular shape in a top view to surround the first region 16. However, the grooved part 17 can surround the region in another shape, such as an annular or diamond annular shape.

The width of the grooved part 17 surrounding the first region can be substantially the same over the entire perimeter, or can differ in sections. The width of the grooved part 17 is preferably in a range of 30 µm to 200 µm. The grooved part 17 having a width of 30 µm or larger can make it easy to contain the reflecting material-containing layer 30a described later in the groove of the grooved part 17. The grooved part 17 having a width of 200 µm at most can reduce the amount of the first cover member 30. The grooved part 17 having a width of 200 µm at most can enhance the strength of the substrate 2 as well.

The depth of the grooved part 17 is preferably in a range of 10 µm to 150 µm. The grooved part 17 having a depth of at least 10 µm can make it easy to contain the reflecting material-containing layer 30a described later in the groove of the grooved part 17. The grooved part 17 having a depth of at least 10 µm can also facilitate settling of the first reflecting material. The grooved part 17 having a depth of 150 µm at most can reduce the amount of the first cover member 30.

The grooved part 17 is preferably disposed adjacent to the light emitting element 20. Specifically, the grooved part 17 is preferably formed in the position of no more than 100 µm apart from the lateral surfaces of the light emitting element 20. In other words, the grooved part is formed such that the distance between the lateral surfaces of the light emitting element 20 and the upper edge of the inner perimeter of the grooved part 17 is 100 µm at most. Such a distance from the light emitting element 20 of 100 µm at most can facilitate reflection of the light from the light emitting element 20 by the reflecting material-containing layer 30a, thereby improving the light emission efficiency. In order to further improve the light emission efficiency, the grooved part 17 is preferably formed closer to the light emitting element 20, more preferably formed at the position that is 0 µm from the light emitting element 20 such that the inner lateral surface of the grooved part 17 is disposed along the outer lateral surfaces of the light emitting element 20. As long as the upper edge of the outer perimeter of the grooved part 17 is positioned outward of the outer edges of the light emitting element 20 in a top view, the parts directly under the lateral surfaces of the light emitting element 20 can be located above the grooved part 17. In this case, it is preferable to set the distance between the lateral surfaces of the light emitting element 20 and the upper edge of the inner perimeter of the grooved part 17 to 50 μm at most, considering the mountability and the heat dissipation of the light emitting element 20.

For the first lead electrode 2a and the second lead electrode 2b, for example, Fe, Cu, Ni, Al, Ag, Au, or an alloy including one of these, can be used.

Surface plating can be applied to the first lead electrode 2a and the second lead electrode 2b. For example, Au, Ag, Cu, Pt, or an alloy including one of these can be used for plating. Using these materials for plating can further increase the reflectance for the light emitted from the light emitting element 20 towards the lead electrodes.

The resin walls 3 are formed in the edge portion of the upper surface of the substrate 2. The outer wall surfaces of the resin walls 3 are formed along the outer lateral surfaces of the substrate 2. The inner wall surfaces of the resin walls 3 are oblique such that the opening of the recessed part 15 becomes wider from the substrate 2 to its open end. The resin walls 3 are also disposed in the groove formed at the upper surface of the substrate 2, to thereby enhance the adhesion between the resin walls 3 and the substrate 2.

For the resin walls 3 and the resin molded part 2c, for example, thermoplastic resins, such as PA (polyamide), PPA (polyphthalamide), PPS (polyphenylene sulfide), or liquid polymer, or thermosetting resins, such as epoxy resins, silicone resins, modified epoxy resins, urethane resins, or phenol resins, can be used.

The resin walls 3 and the resin molded part 2c can be integrally formed using the same material.

The light emitting element 20 is a semiconductor element that itself emits light when a voltage is applied. The light emitting element 20 in the present embodiment includes a light transmissive support substrate 21 and a semiconductor layer 22 formed on the support substrate 21. Besides an insulation material, a conductive material can be used for the support substrate 21. Any shape, size, and the like can be selected for the light emitting element 20. For the emission color of the light emitting element 20, one having any wavelength can be selected in accordance with the application. For example, for the light emitting element 20 emitting blue light (i.e., light having a wavelength in a range of 430 nm to 490 nm) or green light (i.e., light having a wavelength in a range of 495 nm to 565 nm), one using a nitride-based semiconductor ($In_XAl_YGa_{1-X-Y}N$, $0 \leq X$, $0 \leq Y$, $X+Y \leq 1$), GaP, or the like can be employed. For the light emitting element 20 emitting red light (i.e., light having a wavelength in a range of 610 nm to 700 nm), GaAlAs, AlInGaP, or the like, besides a nitride-based semiconductor element, can be employed.

The thickness of the light emitting element 20 (i.e., from the lower surface of the support substrate 21 to the upper surface of the semiconductor layer 22) is set, for example, in a range of 100 μm to 300 μm.

The light emitting element 20 includes a pair of electrodes on the upper surface, and is mounted on the first lead electrode 2a at the bottom surface of the recessed part 15 of the package 10 with the electrode side facing up. In the present embodiment, one of the electrodes of the light emitting element 20 is connected to the first lead electrode 2a via a conductive member such as a wire 23, and the other electrode is connected to the second lead electrode 2b via a conductive wire such as a wire 24.

Mounting the light emitting element 20 with the electrode side facing up allows the semiconductor layer 22 of the light emitting element 20 to be placed on the upper surface side (i.e., the light extraction surface side of the light emitting device 100). In this manner, the lateral surfaces of the semiconductor layer 22 is less likely to be covered by the first cover member 30.

Such a structure can reduce the loss of primary light attributable to reflection by the lateral surfaces of the light emitting element 20. Moreover, the increased primary light extractable from the lateral surfaces of the light emitting element 20 can further improve the light distribution characteristics of the light emitting device 100.

The first cover member 30 is formed in the groove of the grooved part 17, and to cover some portions of the lateral surfaces of the light emitting element 20. The first cover member 30 is formed with a first resin that contains a first reflecting material. In the present embodiment, the first cover member 30 is formed such that a first reflecting material-containing layer 30a and a light transmitting layer 30b containing substantially no first reflecting material are formed at the grooved part 17 from the bottom side of the recessed part 15 in that order. The reflecting material-containing layer 30a is disposed in the groove of the grooved part 17. Disposing the reflecting material-containing layer 30a in the groove of the grooved part 17 can inhibit the first reflecting material-containing layer 30a to face the lateral surfaces of the light emitting element 20 while facilitating reflection of the light from the light emitting element 20, to thereby improve the light emission efficiency.

The light transmitting layer 30b is positioned above the reflecting material-containing layer 30a while covering some portions of the second cover member 40. The light transmitting layer 30b covers some portions of the lateral surfaces of the light emitting element 20, but can cover the lateral surfaces entirely.

The lateral surfaces of the light emitting element 20 in the present embodiment include the lateral surfaces of the support substrate 21 and the lateral surfaces of the semiconductor layer 22.

The reflecting material-containing layer 30a is a layer created by settling the first reflecting material, and is the portion of the first cover member 30 that has a high concentration of the first reflecting material in the depth direction. The light transmitting layer 30b is a layer formed after the first reflecting material has been settled, and is primarily composed of a resin formed on the upper side. In other words, there is no clear interface between the reflecting material-containing layer 30a and the light transmitting layer 30b.

The reflecting material-containing layer 30a is preferably disposed so as not to cover the lateral surfaces of the light emitting element 20. This can increase the efficiency of extracting light from the lateral surfaces of the light emitting element 20, thereby improving the light distribution characteristics in the lateral directions of the light emitting element 20.

Examples of resin materials employed for the first resin include thermosetting resins, such as epoxy resins, modified epoxy resins, silicone resins, modified silicone resins, and the like.

The viscosity of the first resin is preferably in a range of 0.3 Pa·s to 15 Pa·s at room temperature (20±5° C.). The first resin having a viscosity of at least 0.3 Pa·s can facilitate the application of the first resin at the bottom surface of the recessed part 15 by a potting process. The first resin having a viscosity of 15 Pa·s at most can promote changing a shape of the first cover member 30 under centrifugal force. The first resin having a viscosity of 15 Pa·s at most can also facilitate settling of the first reflecting material under centrifugal force. The preferable viscosity of the first resin for achieving the effects described above is in a range of 0.5 Pa·s to 6 Pa·s.

The viscosity of the first resin here is the viscosity in the state of containing the first reflecting material, and the state before settling the first reflecting material contained in the first resin by centrifugal force as described later.

Examples of light reflecting materials employed as the first reflecting material include titanium oxide, silica, silicon oxide, aluminum oxide, zirconium oxide, magnesium oxide, potassium titanate, zinc oxide, boron nitride, and the like. Among such examples, titanium oxide having a relatively high refractive index is preferable from a light reflection perspective.

For the first reflecting material, one having a larger specific gravity than the resin employed for the first resin is preferably used. The specific gravity difference between the first reflecting material and the resin material can facilitate the settling of the first reflecting material in the groove of the grooved part 17 under centrifugal force. Furthermore, using a material having a large particle diameter for the first reflecting material can more quickly settle the first reflecting material in the groove of the grooved part 17.

The use of centrifugal force can dispose the first reflecting material with high density, which reduces the interparticle spacing, thereby reducing leakage or transmission of light and improving light reflection by the first reflecting material-containing layer 30a.

The particle diameter of the first reflecting material is preferably in a range of 0.1 μm to 1.0 μm. A particle diameter of at least 0.1 μm can facilitate the settling of the first reflecting material under centrifugal force. A particle diameter of 1.0 μm at most can facilitate the reflection of visible light. From the above described perspective, the particle diameter of the first reflecting material is more preferably in a range of 0.4 μm to 0.6 μm.

The second cover member 40 is a member for reflecting the emitted light from the light emitting element 20.

The interior surface of the recessed part 15 except for the region where the grooved part 17 is present is preferably covered with the second cover member 40 such that the light emitted by the light emitting element 20 is not transmitted or absorbed by the bottom surface or the lateral surfaces of the recessed part 15.

The second cover member 40 is formed to cover the lateral surfaces of the recessed part 15 of the package 10. The second cover member 40 continuously covers from the lateral surfaces of the recessed part 15 to the upper edge of the outer perimeter of the grooved part 17. In other words, the second cover member 40 continuously covers from the upper edges of the lateral surfaces of the recessed part 15 to the upper edge of the outer perimeter of the grooved part 17. The second cover member 40 is formed by using a second resin that contains a second reflecting material. The second cover member 40 more preferably covers the lateral surfaces of the recessed part 15 across substantially entirely in the height direction, but at a minimum condition, preferably covers the inner lateral surfaces of the recessed part 15 such that the upper edges of the second cover member are higher than the upper surface of the light emitting element in a cross-sectional view. The second cover member 40 is disposed from the inner wall surfaces of the resin walls 3 to the region immediately before the grooved part 17. The second cover member 40 is formed such that the upper surface is covered by the light transmitting layer 30b from the outer edge of the groove 17 to a predetermined position.

The second cover member 40 is a member in which the second reflecting material is dispersed in the second resin. In the present embodiment, the second reflecting material being dispersed in the second resin means that the reflecting material is dispersed to sufficiently function as a reflecting layer. For example, it suffices that the state of dispersion achieved in the case of applying a resin that contains a reflecting material by a method known in the art. The second reflecting material can be partially localized in the second cover member 40 as long as the second cover member can function as a reflecting layer.

The concentration of the second reflecting material relative to the second cover member 40, for example, can be in a range of 10 mass percentage to 50 mass percentage.

Covering the bottom surface and the lateral surfaces of the recessed part 15 with the second cover member 40 can inhibit light transmittance or absorption at the bottom surface and the lateral surfaces of the recessed part 15.

Examples of resin materials employed for the second resin include thermosetting resins, such as epoxy resins, modified epoxy resins, silicone resins, modified silicone resins and the like. Examples of light reflecting materials employed for the second reflecting material include titanium oxide, silica, silicon oxide, aluminum oxide, zirconium oxide, magnesium oxide, potassium titanate, zinc oxide, boron nitride, and the like. Among such examples, from a light reflection perspective, titanium oxide, which has a relatively high refractive index, is preferably used.

The light transmitting member 50 is formed on the first cover member 30, the light emitting element 20, and the second cover member 40. The light transmitting member 50 is formed with a resin that transmits light.

Examples of resin materials employed for the light transmitting member 50 include thermosetting resins, such as epoxy resins, modified epoxy resins, silicone resins, modified silicone resins, and the like. The resin material used for the light transmitting member 50 can be the same as or different from the resin material used for the first or second resin described earlier. Alternatively, a hard resin can be employed for the light transmitting member 50 while using a highly heat resistant resin for the first and second resins.

The first resin described earlier is preferably softer than the resin used for the light transmitting member 50. Because the first resin is disposed in the vicinity of the bonding region between the light emitting element 20 and the substrate 20, a material less likely to expand by heat and having flexibility relative to heat is preferably used so as not to cause excessive stress attributable to thermal expansion.

Silicone resins generally have a higher light resistance than epoxy resins near 450 nm to 500 nm, and epoxy resins are harder than silicone resins. Accordingly, a silicone resin can be used for the first and second resins, and an epoxy resin can be used for the light transmitting member 50.

The light transmitting member 50 can contain a wavelength conversion material. Examples of wavelength conversion materials include phosphors. The light transmitting member 50 can contain a diffuser, filler, or the like, in accordance with the purpose.

For the phosphor, a phosphor known in the art can be used. Examples of such phosphors include yellow light emitting phosphors, such as YAG ($Y_3Al_5O_{12}$:Ce) and silicate, red light emitting phosphors, such as CASN ($CaAlSiN_3$:Eu) and KSF ($K_2SiF_6$:Mn), or green light emitting phosphors, such as chlorosilicate and $BaSiO_4$:$Eu^{2+}$.

For the diffuser, a diffuser known in the art can be used. For example, barium titanate, titanium oxide, aluminum oxide, silicon oxide, or the like can be used.

Operation of Light Emitting Device

When the light emitting device 100 is activated, an electric current is supplied from an external power supply to the light emitting element 20 via the first lead electrode 2a and the second lead electrode 2b to allow the light emitting element 20 to emit light. The light emitted by the light emitting element 20 traveling upward is extracted upward of the light emitting device 100. The light emitted by the light emitting element 20 traveling downward is reflected by the reflecting material-containing layer 30a and the second cover member 40 in the direction towards the opening of the recessed part 15 to be extracted from the light emitting device 100 to the outside. The light emitted by the light emitting element 20 laterally traveling is reflected by the second cover member 40 in the direction towards the opening of the recessed part 15 to be extracted from the light emitting device 100 to the outside. This can reduce the leakage of the emitted light from the light emitting elements 20 from the bottom surface and the lateral surfaces of the recessed part 15, thereby increasing the light extraction efficiency of the light emitting device 100. This also allows the light emitting device 100 to have less color non-uniformity. With the reflecting material-containing layer 30a disposed in the groove of the grooved part 17, the light emitting device 100 can have improved light extraction efficiency and light emission efficiency.

Method of Manufacturing Light Emitting Device 100

One example of a method of manufacturing a light emitting device according to an embodiment of the present disclosure will be explained next.

Figure 2:
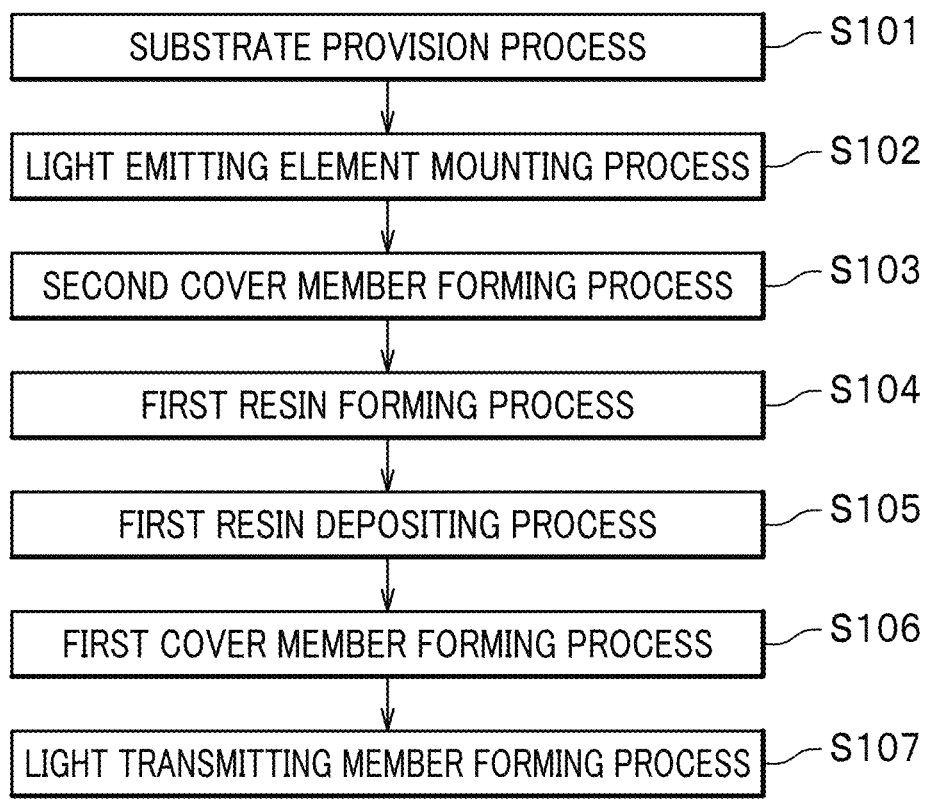
FIG. 2 is a flowchart of a method of manufacturing a light emitting device according to an embodiment.
Figure 3A:
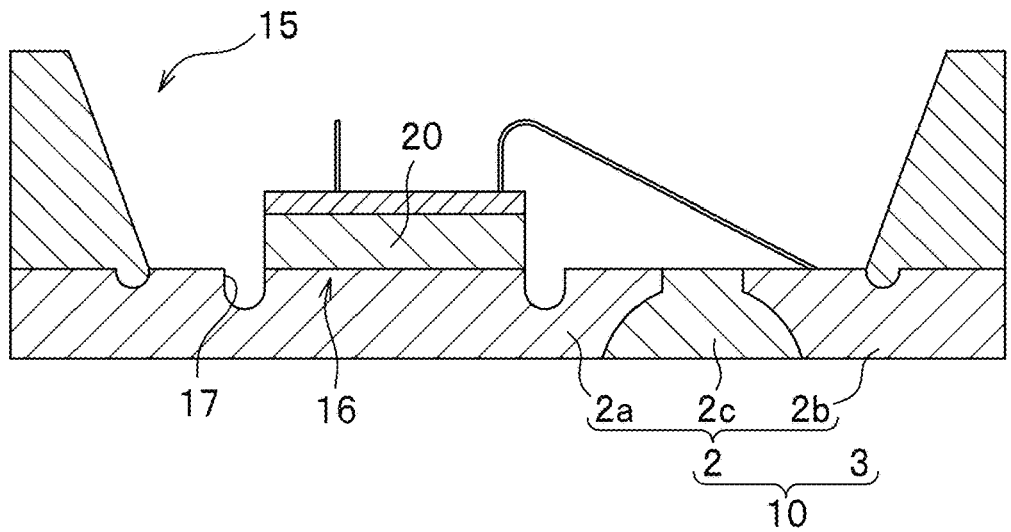
FIG. 3A is a schematic cross-sectional view showing a process of mounting a light emitting element in the method of manufacturing a light emitting device according to the embodiment.
Figure 3B:
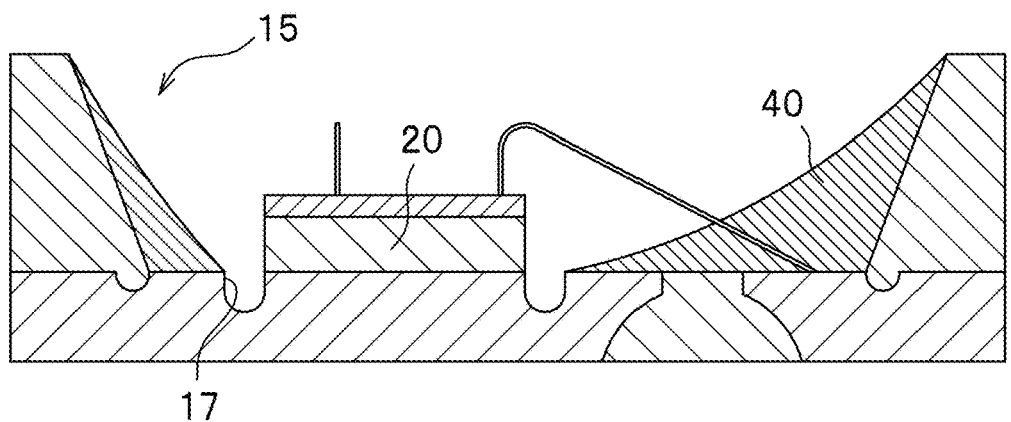
FIG. 3B is a schematic cross-sectional view showing a process of forming a second cover member in the method of manufacturing a light emitting device according to the embodiment.
Figure 3C:
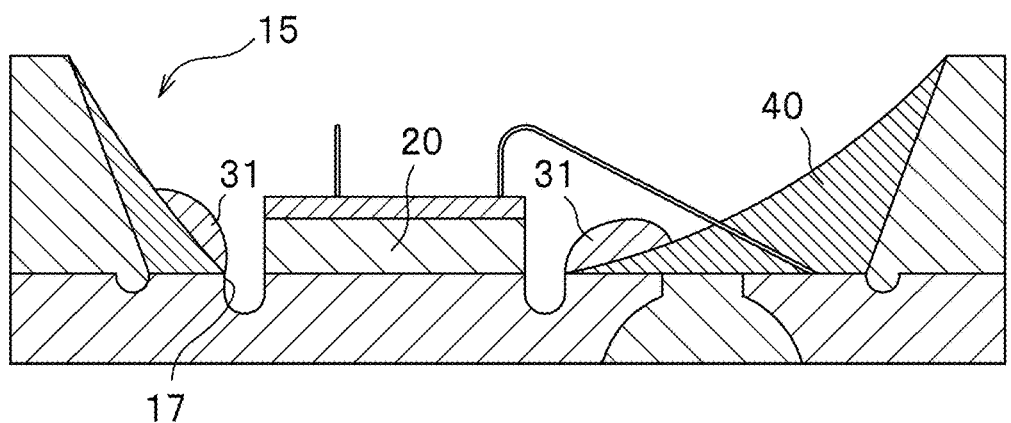
FIG. 3C is a schematic cross-sectional view showing a process of forming a first resin in the method of manufacturing a light emitting device according to the embodiment.
Figure 3D:
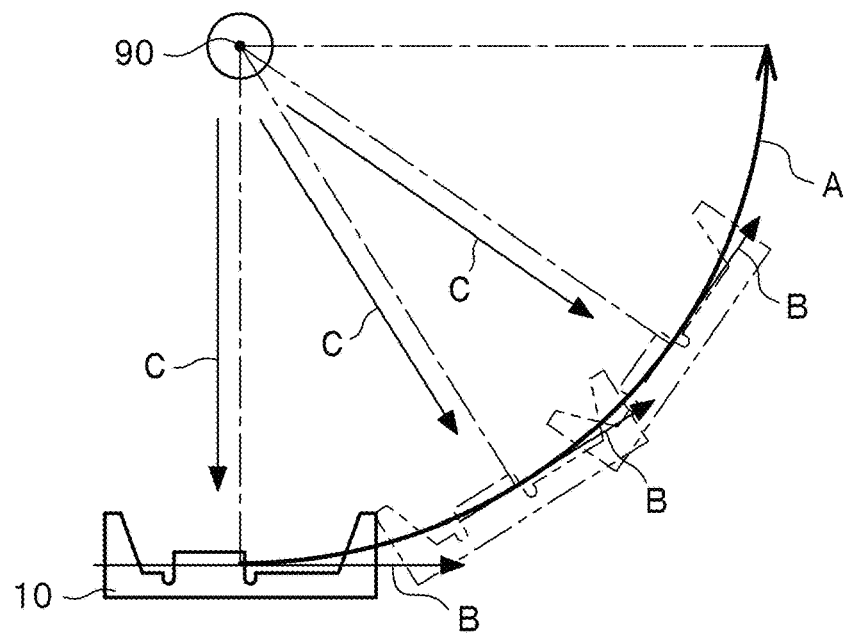
FIG. 3D is a schematic diagram showing a process of forming a first cover member by allowing the first reflecting material to settle under centrifugal force in the method of manufacturing a light emitting device according to the embodiment.
Figure 3E:
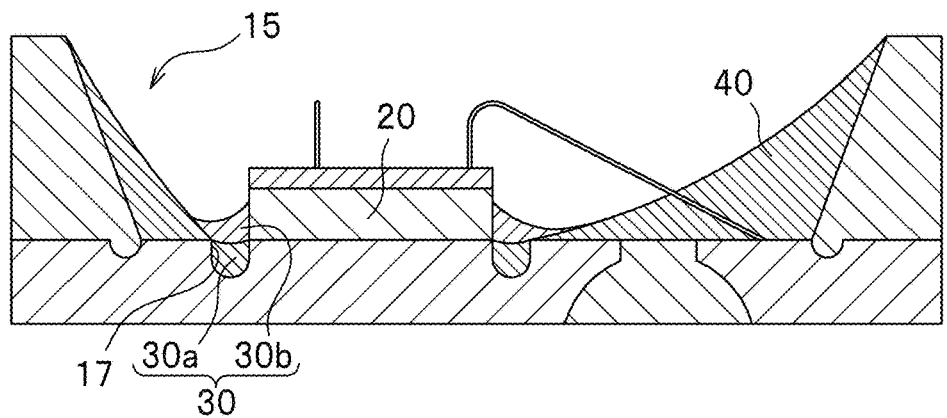
FIG. 3E is a schematic cross-sectional view of a process of forming a first cover member in the method of manufacturing a light emitting device according to the embodiment, showing the state after settling the first reflecting material by centrifugal force.
Figure 3F:
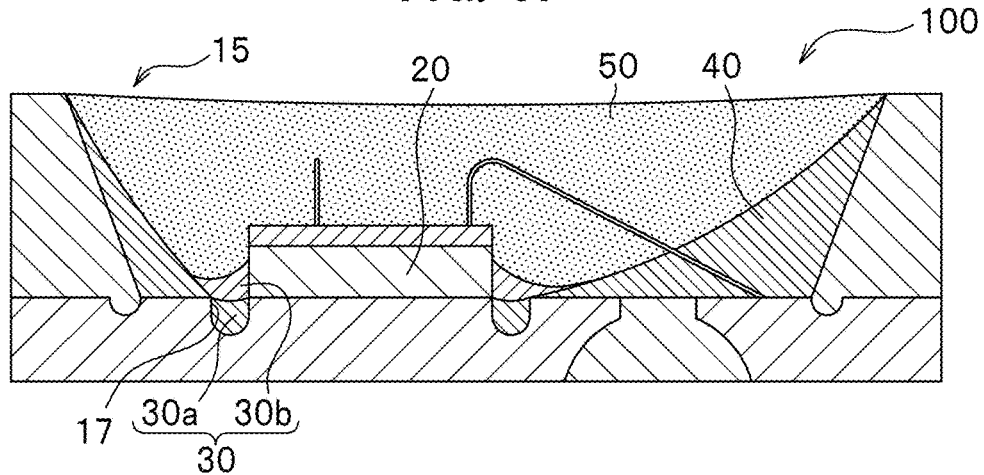
FIG. 3F is a schematic cross-sectional view showing a process of forming a light transmitting member in the method of manufacturing a light emitting device according to the embodiment.

FIG. 2 is a flowchart of the method of manufacturing a light emitting device according to the embodiment. FIG. 3A is a cross-sectional view showing a process of mounting a light emitting element in the method of manufacturing a light emitting device according to the embodiment. FIG. 3B is a cross-sectional view showing a process of forming a second cover member in the method of manufacturing a light emitting device according to the embodiment. FIG. 3C is a cross-sectional view showing a process of forming a first resin in the method of manufacturing a light emitting device according to the embodiment. FIG. 3D is a schematic diagram of a process of forming a first cover member in the method of manufacturing a light emitting device according to the embodiment, schematically showing the process of settling the first reflecting material under centrifugal force. FIG. 3E is a schematic cross-sectional view of a process of forming a first cover member in the method of manufacturing a light emitting device according to the embodiment, showing the state after settling the first reflecting material by centrifugal force. FIG. 3F is a schematic cross-sectional view of a process of forming a light transmitting member in the method of manufacturing a light emitting device according to the embodiment.

The method of manufacturing a light emitting device 100 includes: a substrate providing process S101 of providing a substrate 2 that includes a grooved part 17 surrounding a first region 16; a light emitting element mounting process S102 of mounting a light emitting element 20 in the first region 16; a second cover member forming process S103 of forming a second cover member 40 by allowing a second resin to continuously cover from the lateral surfaces of the recessed part 15 to the upper edge of the outer perimeter of the grooved part 17; a first resin forming process S104; a first resin depositing process S105 of forming a first resin in the groove of the grooved part 17, the first resin containing a first reflecting material; a first cover member forming process S106 of forming a first cover member 30 that include a reflecting material-containing layer 30a and a light transmitting layer 30b by applying centrifugal force, the reflecting material-containing layer 30a formed in the groove of the grooved part 17 being obtained by settling a first reflecting material in a first resin, and the light transmitting layer 30b covering at least a portion of lateral surfaces of the light emitting element 20; and a light transmitting member forming process S107 of forming a light transmitting member 50 on the first cover member 30 and the light emitting element 20.

The material, location, and the like of each member are as described with reference to the light emitting device 100 above, and the explanation thus will be omitted here as appropriate.

Substrate Providing Process

The substrate providing process S101 comprises providing a substrate that includes a grooved part 17 surrounding a first region 16.

In the process S101, a package 10 is provided that has a recessed part 15 defined by an upper surface of a substrate 2 and lateral surfaces of resin walls 3.

In the process S101, a grooved part 17 that surrounds a first region 16 is formed in the first lead electrode 2a. The grooved part 17 can be formed by, for example, etching or press forming. A plating layer is formed on the surfaces of the first lead electrode 2a and the second lead electrode 2b, as needed, by electroless plating or electroplating. Grooves used in disposing resin walls 3 can be formed in the first lead electrode 2a and the second lead electrode 2b at the same time the grooved part 17 is formed. After placing the first lead electrode 2a and the second lead electrode 2b in a mold for manufacturing a package, a resin for forming resin walls 3 and a resin molded part 2c is injected into the mold, and the resin is hardened. In this manner, a package 10 having a grooved part 17 created in the substrate 2 can be manufactured.

For the process S101, a substrate with a preformed groove can be provided.

Light Emitting Element Mounting Process

The light emitting element mounting process S102 comprises mounting a light emitting element 20 in the first region 16.

In the process S102, a light emitting element 20 is mounted on the bottom surface of the recessed part 15 of the package 10. In the present embodiment, the light emitting element 20 is disposed on the first lead electrode 2a. The light emitting element 20 is mounted on the bottom surface of the recessed part 15 with the electrode formed surface facing up by using a non-conductive bonding material. That is, the electrode formed surface is used as the primary light extraction surface, and the surface opposite to the electrode formed surface is used as the mounting surface. For the non-conductive bonding material, for example, an epoxy resin or silicone resin can be used. The light emitting element 20 can be flip-chip mounted, and in this case, it is mounted using a conductive bonding material. For the conductive bonding material, for example, eutectic solder, conductive past, bumps, or the like can be used.

Second Cover Member Forming Process

The second cover member forming process S103 comprises forming a second cover member 40 by allowing a second resin to continuously cover from the lateral surfaces of the recessed part 15 to the upper edge of the outer perimeter of the grooved part 17.

In the process S103, a second resin that covers the lateral surfaces of the recessed part 15 is disposed by a potting process, for example. The second resin can be disposed in the recessed part 15 by using a resin dispenser containing an uncured second resin material such that the uncured resin material is discharged from the nozzle at the tip of the dispenser in the vicinity of the outer edges of the bottom surface of the recessed part 15, preferably along the boundaries with the lateral surfaces. The uncured second resin covers the lateral surfaces of the recessed part 15 by wetting and spreading over thereon. At this time, because the second resin also flows onto the bottom surface of the recessed part 15, the second resin also covers a portion of the bottom surface of the recessed part 15. At this time, the viscosity and the dispensing positions of the second resin are preferably preadjusted such that the second resin flowing onto the bottom surface of the recessed part 15 would not reach the upper edge of the outer perimeter of the grooved part 17 and not wet or spread over the grooved part 17, but can creep up to the upper portions of the lateral surfaces of the recessed part 15. In the case of forming the second cover member 40 by a potting process, the viscosity of the second resin is adjusted, for example, to be in a range of 1 Pa·s to 50 Pa·s at room temperature (20±5° C.).

If the second resin flows into the groove of the grooved part 17, it might run beyond the upper edge of the inner perimeter of the grooved part 17 while wetting and spreading over the lateral surfaces of the light emitting element 20. This might hinder the extraction of light from the lateral surfaces of the light emitting element 20. Thus, it is preferable not to allow the second resin to cover the interior of the groove of the grooved part 17.

The interior surfaces of the recessed part 15 of the package 10 can be pre-impregnated with an organic solvent. Pre-impregnating the interior surfaces of the recessed part 15 with an organic solvent can promote the creeping of the second resin onto the lateral surfaces of the recessed part 15. Employing a material having high wettability for the lateral surfaces of the recessed part 15, or roughening the surfaces thereof, can also facilitate the creeping of the resin onto the lateral surfaces of the recessed part 15.

The second resin before hardening contains a second reflecting material, and the concentration of the second reflecting material in the second resin is preferably 10 mass percentage to 50 mass percentage.

The second resin wets and spreads over the lateral surfaces of the recessed part 15 when disposed in the vicinity of the outer edges of the bottom surface of the recessed part 15 using a potting process. At this point, the second cover member 40 is in the state where the second reflecting material is dispersed in the second resin.

Subsequently, the second resin is allowed to harden at a temperature of, for example, 120° C. to 200° C. to form the second cover member 40. The second resin is preferably hardened after wetting and spreading over the lateral surfaces of the recessed part 15 and in the condition where the package is not moved.

First Resin Forming Process

The first resin forming process S104 comprises mixing a base agent of a two-part curing-type resin material and a first reflecting material, followed by mixing a hardening agent a predetermined time period.

Using the first resin formed in this manner can enhance the affinity between the first reflecting material and the resin material. This can facilitate the settling of the first reflecting material under centrifugal force. The temperature prior to mixing the hardening agent is room temperature.

Examples of two-part curing-type resin materials include silicone resins, modified silicone resins, epoxy resins, modified epoxy resins, and the like.

The time allowed to elapse after mixing the base agent of two-part curing-type resin material and the first reflecting material is preferably at least two hours from a perspective of further facilitating the settling of the first reflecting material. The time allowed to elapse is preferably eight hours at most from a manufacturing time reduction perspective. After mixing the hardening agent, the subsequent step is performed before the first resin hardens.

The concentration of the first reflecting material relative to the uncured first resin is, for example, about 15 mass percentage to about 60 mass percentage.

First Resin Depositing Process

The first resin depositing process S105 forming a first resin 31 in the groove of the grooved part 17. The first resin 31 contains a first reflecting material.

In the process S105, an uncured first resin 31 is disposed between the lateral surfaces of the recessed part 15 and the upper edge of the outer perimeter of the groove 17, for example, by a potting process. Specifically, the uncured first resin 31 is disposed on the second cover member 40 that continuously covers from the lateral surfaces of the recessed part 15 to the upper edge of the outer perimeter of the grooved part 17. By disposing the first resin on the second cover member 40 in the vicinity of the grooved part 17, the first resin flows into and formed in the grooved part 17. Preferably, the uncured first resin 31 is disposed, for example, at two locations near the opposing lateral surfaces of the light emitting element 20 to be allowed to flow into and be formed in the groove by its own weight or centrifugal force. This can allow the first resin flowed into the groove to move inside the groove in parallel with the bottom surface of the recessed part 15, to thereby inhibit the first resin from wetting and spreading in the vertical direction before being formed in the groove.

In other words, potting the first resin 31 not directly in the grooved part 17 can inhibit the first resin from flowing towards the light emitting element 20, to thereby inhibit the first resin from creeping onto the lateral surfaces of the light emitting element 20 before being rotated under centrifugal force. The creeping of the first resin onto the lateral surfaces of the light emitting element 20 can be avoided as the shape of the first resin changes after rotating under centrifugal force. Depending on the viscosity of the first resin and the rotational speed, however, the first reflecting material contained in the first resin might remain on the lateral surfaces of the light emitting element 20. Thus, preferably, the first resin does not cover the lateral surfaces of the light emitting element 20 prior to rotation under centrifugal force.

In the case in which the first resin does not readily flow inside the groove because of the viscosity of the resin or the like, the first resin 31 can be disposed directly in the groove by a potting process or the like.

First Cover Member Forming Process

The first cover member forming process S106 forms a first cover member 30 by applying centrifugal force to the substrate on which the first resin is disposed at the grooved part 17, to obtain the reflecting material-containing layer 30a and a light transmitting layer 30b. The reflecting material-containing layer 30a, which contains a first reflecting material and is disposed in the groove of the grooved part 17, can be obtained by settling the first reflecting material contained in the first resin by applying the centrifugal force. The light transmitting layer 30b covers at least some portions of the lateral surfaces of the light emitting element 20 by the centrifugal force.

In the process S106, the substrate 2, i.e., the package 10, is rotated under centrifugal force in the direction that applies the centrifugal force to the bottom surface of the recessed part 15. Forcibly settling the first reflecting material in the first resin towards the bottom surface of the recessed part 15 under centrifugal force can form the reflecting material-containing layer 30a containing a high concentration of the first reflecting material, as a first reflecting material settled layer, and a light transmitting layer 30b as a supernatant. Forming the reflecting material-containing layer 30a by centrifugal settling in this manner can increase the density of the first reflecting particles on the bottom surface side even with a reduced amount of the first reflecting material contained in the first resin. In the manner described above, the reflecting material-containing layer 30a disposed in the groove of the grooved part 17, and the light transmitting layer 30b covering some portions of the lateral surfaces of the light emitting element 20 can be formed.

In the case of using centrifugal force to allow the first resin to flow inside the groove in the first resin depositing process S105, the centrifugal force rotation can simultaneously accomplish the centrifugal force rotation performed in the process S106.

As shown in FIG. 3D, the rotation of the package 10 is preferably performed by applying centrifugal force to the package 10 around a rotary shaft 90 such that the upper surface of the substrate 2, i.e., the bottom surface of the recessed part 15, is positioned outward. Specifically, the package 10 is moved in direction A revolving around the rotary shaft 90 that is positioned on the upper surface side of the package 10. Direction B in FIG. 3D parallels the bottom surface of the recessed part 15. FIG. 3D, three arrows indicating direction B are shown along the movement of the package 10, but direction B is continuous in reality.

The rotary shaft 90 is in parallel to the bottom surface of the recessed part 15 positioned on a line orthogonal to and passing through substantially the center of the bottom surface of the recessed part 15, and is positioned on the open end of the recessed part 15 of the package 10. In this manner, centrifugal force is applied in the direction towards the bottom surface of the recessed part 15, thereby inhibiting the first resin from spreading in the height direction of the package 10 and forcibly settling the first reflecting material contained in the first resin towards the bottom surface of the recessed part 15 (i.e., in the direction indicated by arrow C in FIG. 3D). Allowing the first resin to harden in this state can form the reflecting material-containing layer 30a and the light transmitting layer 30b at the grooved part 17 in that order from the bottom surface of the recessed part 15.

For the first cover member 30, the applying amount and the amount of the first reflecting material contained in the first resin can be suitably adjusted.

Although the rotational speed or number of rotations (e.g. rpm) for the package 10 would depend on the content, particle diameter, and the like of the first reflecting material, the number of rotation and rotation radius can be adjusted such that centrifugal force of at least 200×g applies, for example.

In the manufacturing process, in the case of rotating under centrifugal force packages 10 configuring as a substrate block before being divided into individual packages where the substrate block is a sheet, the larger the area of the substrate block (more specifically, the longer the substrate length in the rotation direction A), the larger the deviations from the rotary shaft 90 result in the packages 10 that are more distant from the center of the substrate block. In a substrate block, for example, a large deviation in direction B from the rotation circumference would cause the first resin surface to become oblique to the bottom surface of the recessed part 15, possibly resulting in variation in the surface condition of the first resin among the packages in the substrate block. These deviations can be reduced by increasing the rotation radius. Specifically, the deviations can be reduced by setting the rotation radius to at least 70 times the length of the substrate block in the rotation direction.

In the case of using resin packages 10 having flexibility where the substrate block flexes along the rotation circumference of the turning radius, the packages would be less susceptible to the deviations described above. Thus, rotation can be performed with a larger substrate block than in the case of employing a substrate block composed of non-flexible packages 10 under the same centrifugal force. This can increase the number of packages processed each time. Examples of flexible substrates block include resin packages linked with leads.

In the process S106, moreover, the first resin is preferably hardened while settling the first reflecting material, i.e., while applying centrifugal force. It is preferable to use a material having a small particle diameter for the first reflecting material. However, particles having small diameter is difficult to settle. Therefore, the first reflecting material is forcibly settled towards the bottom surface of the recessed part 15 by centrifugal force in the process S106. Accordingly, in order to harden the resin while the first reflecting material is being settled, the process of hardening the first resin is preferably performed by maintaining the rotation, i.e., while rotating the package, in the process S106.

Although the resin can be hardened after ceasing the rotation, the resin can readily spread onto the lateral surfaces of the light emitting element 20 due to wettability once the rotation ceases. Accordingly, allowing the first resin to harden while rotating the package 10 can inhibit the first resin from creeping onto the lateral surfaces of the light emitting element 20. Exposing the lateral surfaces of the light emitting element 20 from the first resin can further improve the light extraction efficiency and further enhance the light distribution characteristics of the light emitting device 100.

The hardening temperature for the first resin can be in a range of 40° C. to 200° C. Setting the hardening temperature high can reduce the time required to harden the first resin and is thus efficient. Considering the wobbling of the rotary shaft 90 that can occur as a result of thermal expansion of metal parts of the centrifuge equipment, the hardening temperature is preferably set low to the extent possible. In other words, the hardening temperature for the first resin from an efficiency perspective is preferably 50° C. or higher. The hardening temperature, considering the wobbling of the rotary shaft 90, is preferably 60° C. at most. In the case of hardening the resin at 80° C. or higher, it is preferable to adjust the equipment such that at least the metal parts of the centrifuge equipment will not reach 80° C. or higher.

For the resin material employed for the first resin, one that can achieve at least a semi-hardened state when the rotating package 10 is maintained at 40° C. or a higher temperature is preferably selected.

Examples of methods for hardening the first resin while settling the first reflecting material include the use of a hot air blower, a panel heater, and the like.

Light Transmitting Member Forming Process

The light transmitting member forming process S107 forms a light transmitting member 50 on the first cover member 30, the second cover member 40, and the light emitting element 20.

In the process S107, a resin employed for the light transmitting member 50 is disposed in the recessed part 15 by potting, spraying, or the like. Subsequently, the resin employed for the light transmitting member 50 is hardened at a temperature in a range of, for example, 120° C. to 200° C. to form the light transmitting member 50.

Although certain embodiments of light emitting devices and methods for manufacturing light emitting devices have been specifically explained above, the spirit of the present invention is not limited to those described above, and must be broadly interpreted based on the disclosure made in the scope of the claims. Various modifications and variations made based on these disclosures are also encompassed by the spirit of the present invention.

Other Embodiments

Figure 4:
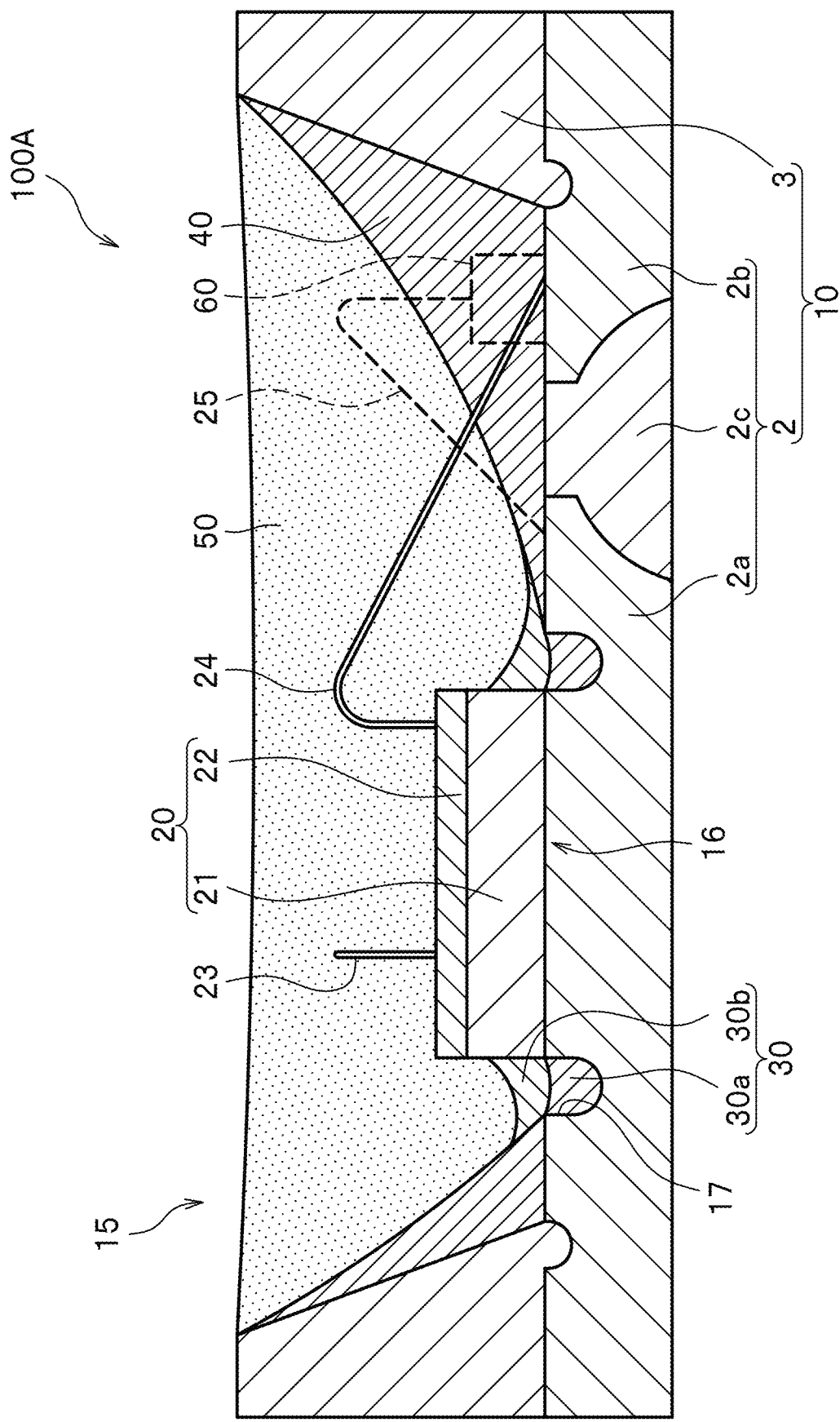
FIG. 4 is a schematic cross-sectional view of a light emitting device according to another embodiment.
Figure 5A:
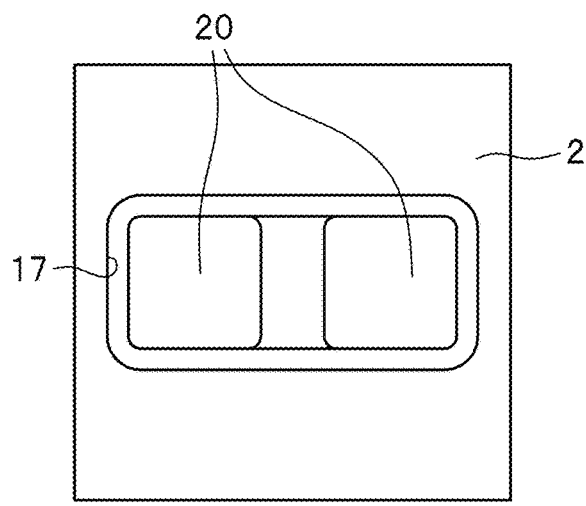
FIG. 5A is a schematic top view of the grooved part of a light emitting device according to another embodiment.
Figure 5B:
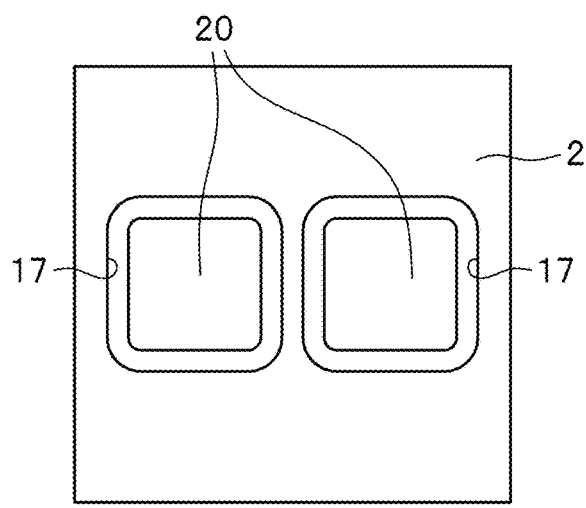
FIG. 5B is a schematic top view of the grooved part of a light emitting device according to another embodiment.
Figure 5C:
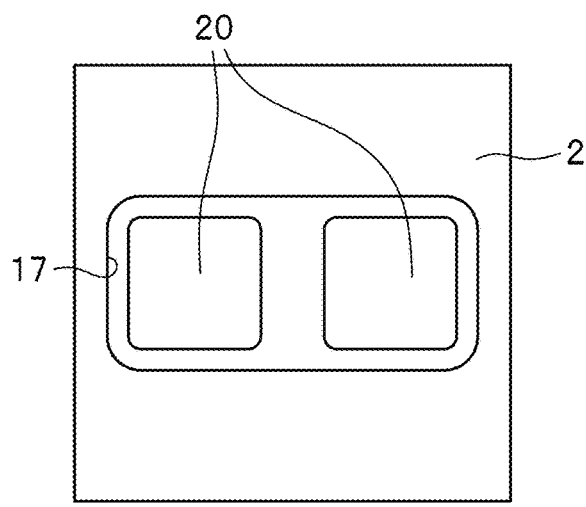
FIG. 5C is a schematic top view of the grooved part of a light emitting device according to another embodiment.

FIG. 4 is a schematic cross-sectional view of a light emitting device according to another embodiment of the present disclosure. FIG. 5A is a schematic top view of the grooved part of a light emitting device according to another embodiment. FIG. 5B is a schematic top view of the grooved part of a light emitting device according to another embodiment. FIG. 5C is a schematic top view of the grooved part of a light emitting device according to another embodiment.

The light emitting device 100A shown in FIG. 4 includes a protective device 60. The protective device 60 has an electrode on the upper surface, and is mounted on the second lead electrode 2b at the bottom surface of the recessed part 15 of the package 10 with the electrode formed surface facing up. In the present embodiment, the electrode of the protective element 60 is connected to the first lead electrode 2a via a conductive member such as a wire 25. The protective device 60, for example, is a Zener diode.

The protective device 60 can be mounted on the bottom surface of the recessed part 15 of the package 10 in the light emitting mounting process S102.

The light emitting device can include a plurality of light emitting elements 20. In the case in which two light emitting elements 20 are included, for example, the grooved part 17 can be a quadrilateral annular grooved part 17 that surrounds the two light emitting elements 20 in a top view, as shown in FIG. 5A. Alternatively, as shown in FIG. 5B, quadrilateral annular grooved parts 17 can be provided to individually surround the two light emitting elements 20 in a top view. Alternatively, as shown in FIG. 5C, the grooved part 17 can be such that the groove between the two light emitting elements 20 is integrally formed.

The light emitting devices explained in the foregoing are of the type where the light emitting elements are mounted with the electrode formed surface facing up, but light emitting elements can be flip-chip mounted. In the case of employing flip-chip mounting for a light emitting element, the light emitting element is preferably raised in the height direction by using a base, such as a submount, bumps, post electrodes, or the like. When a light emitting element is flip-chip mounted, the semiconductor layer is disposed on the bottom surface side of the recessed part of the substrate (i.e., the substrate side of the light emitting device). Raising the light emitting element in the height direction can position the lateral surfaces of the semiconductor layer so as not to be covered by the first cover member in whole or in part.

The light emitting devices explained in the foregoing are of the type that use a package formed with a recess in which a light emitting element is mounted on the bottom surface thereof. The light emitting devices, however, can be those that employ a flat substrate on which a light emitting element is mounted.

A method of manufacturing a light emitting element can include an additional process before, after, or between the processes described earlier to the extent that the processes described earlier are not adversely affected. For example, a foreign matter removal process to remove foreign matter mixed into during manufacturing, and the like, can be included.

In a method of manufacturing a light emitting device, moreover, the order of certain processes is not limited, and can be replaced. For example, in the method of manufacturing a light emitting device described earlier, the first resin forming process followed by the second cover member forming process. The first resin forming process, however, can be performed before the second cover member forming process, the light emitting element mounting process, or the substrate providing process. Alternatively, the method can be adapted to exclude the first resin forming process.

The second cover member forming process has been explained as being performed after the light emitting element mounting process, but before the first resin forming process. The second cover member forming process, however, can be performed before the light emitting element mounting step, or performed after the first cover member forming process, but before the light transmitting member forming process.

EXAMPLES

Examples of the present invention will be explained below.

Figure 6:
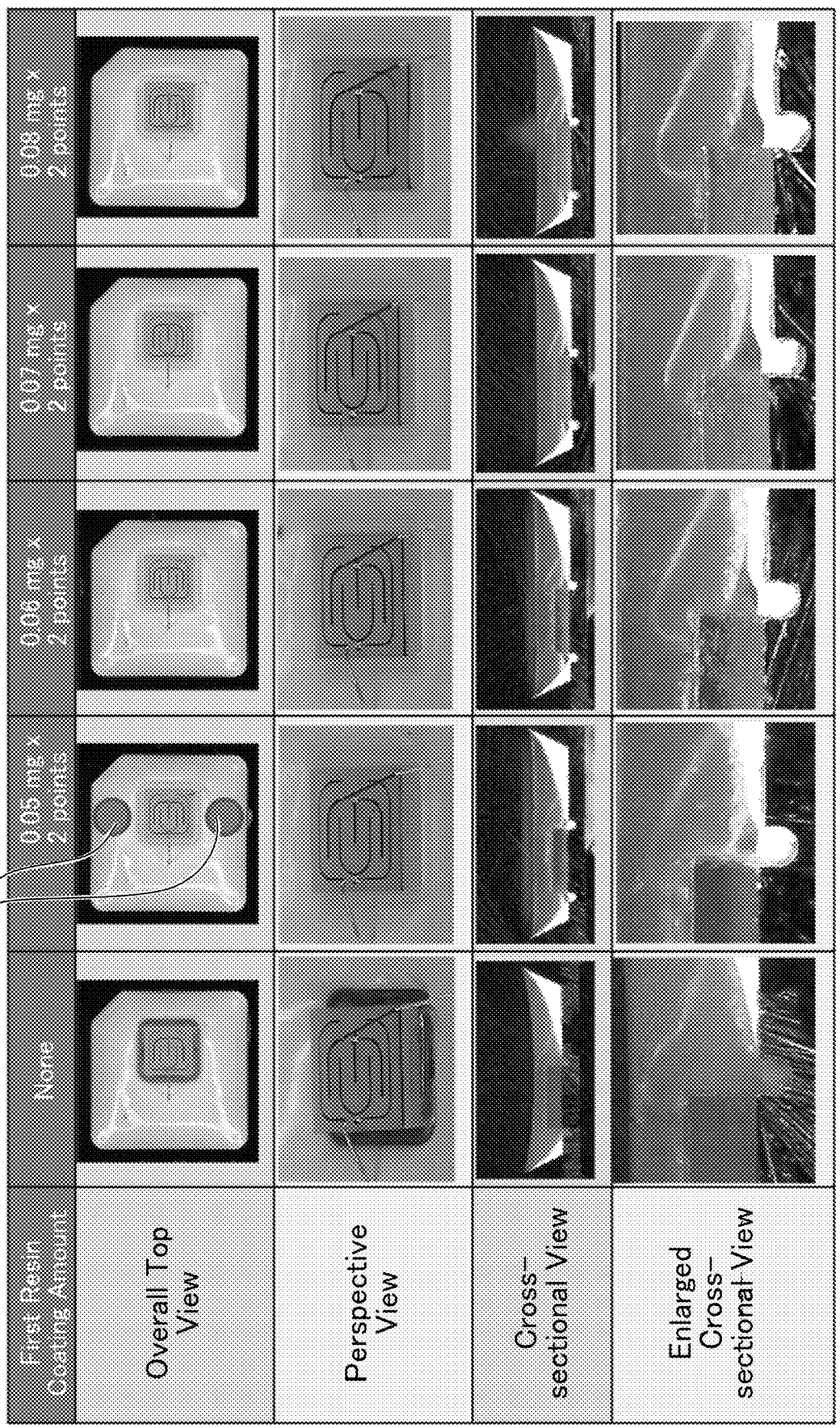
FIG. 6 shows images of the structures of the light emitting devices used in Example 1.
Figure 7A:
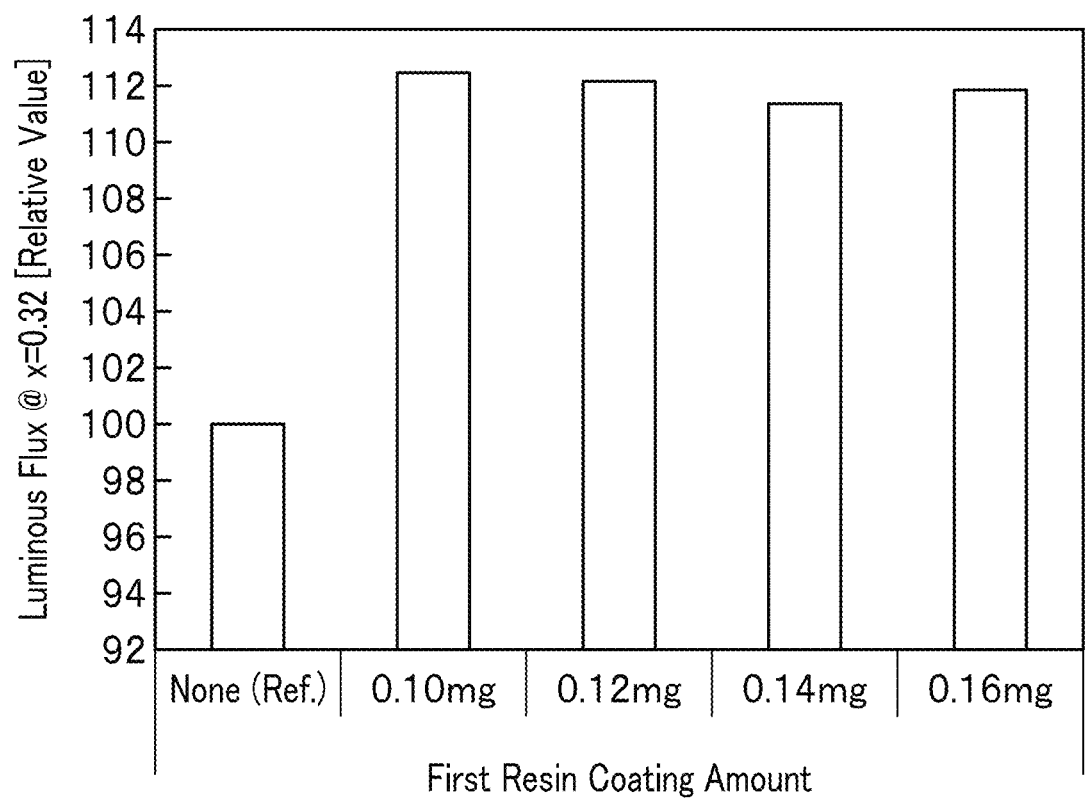
FIG. 7A is a graph showing the relationship between the coating amount of the first resin and the luminous flux in Example 1.
Figure 7B:
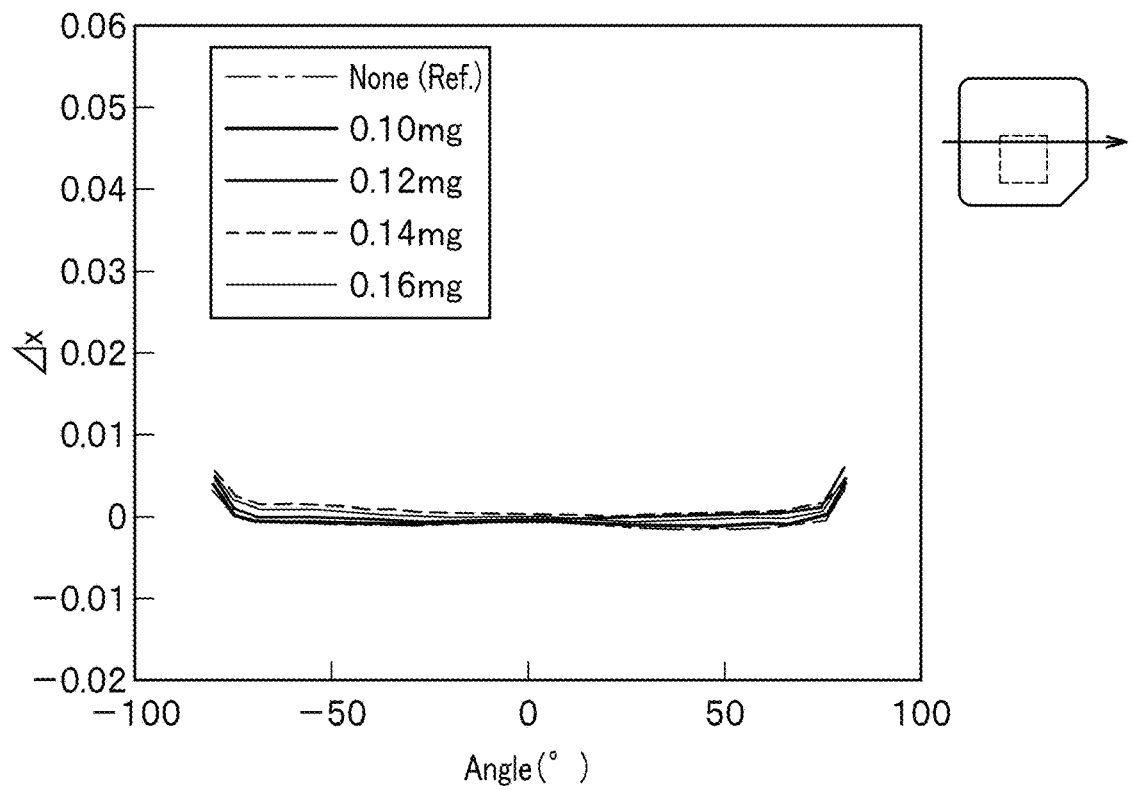
FIG. 7B is a graph showing x chromaticity coordinate deviations at certain directivity angles in Example 1.
Figure 7C:
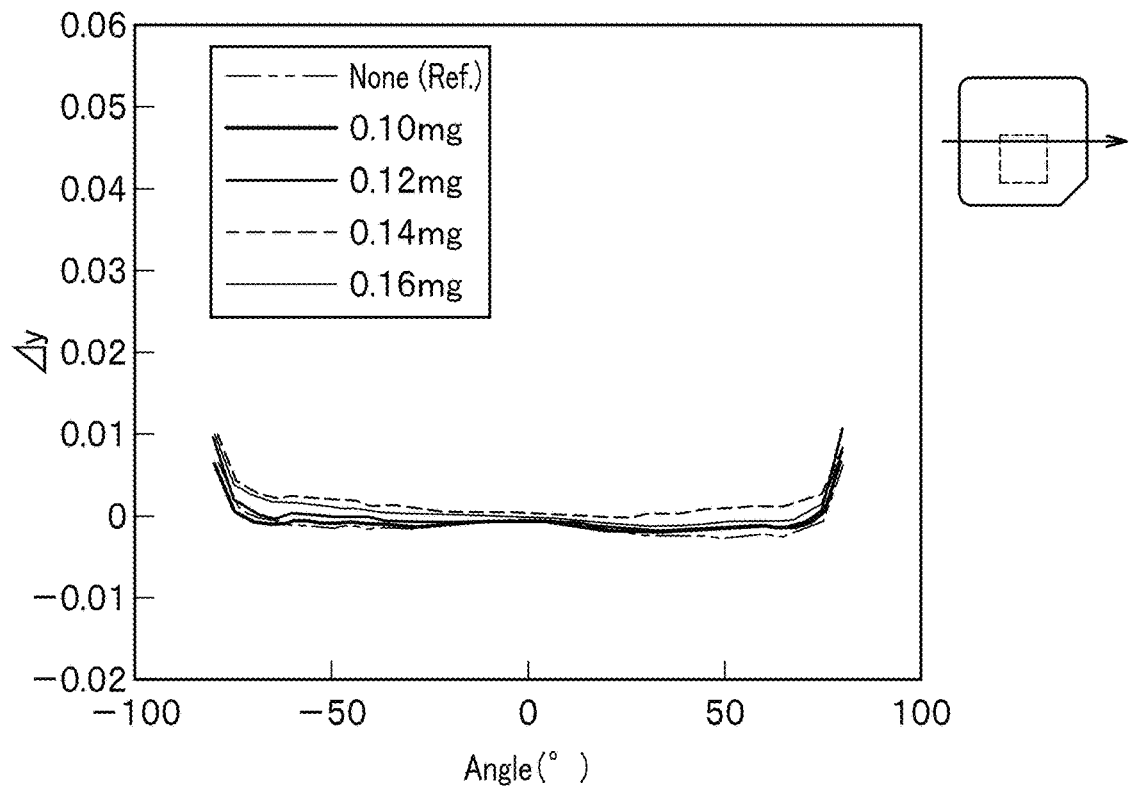
FIG. 7C is a graph showing y chromaticity coordinate deviations at certain directivity angles in Example 1.
Figure 7D:
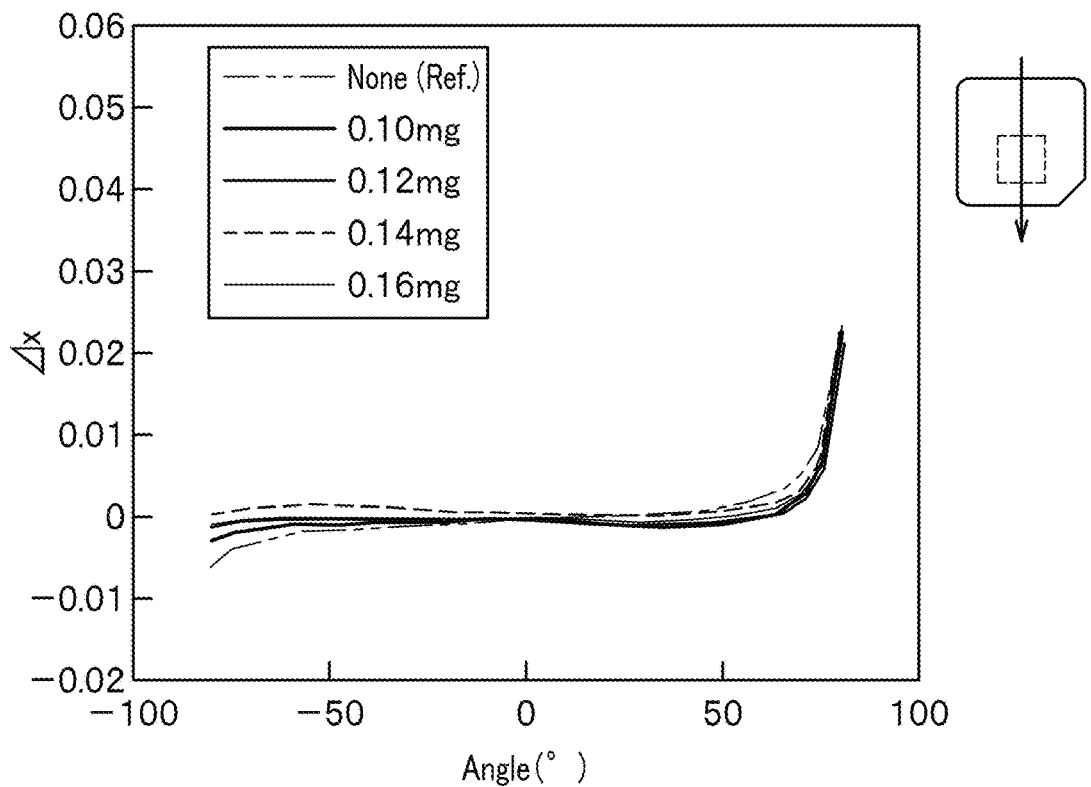
FIG. 7D is a graph showing x chromaticity coordinate deviations at certain directivity angles in Example 1.
Figure 7E:
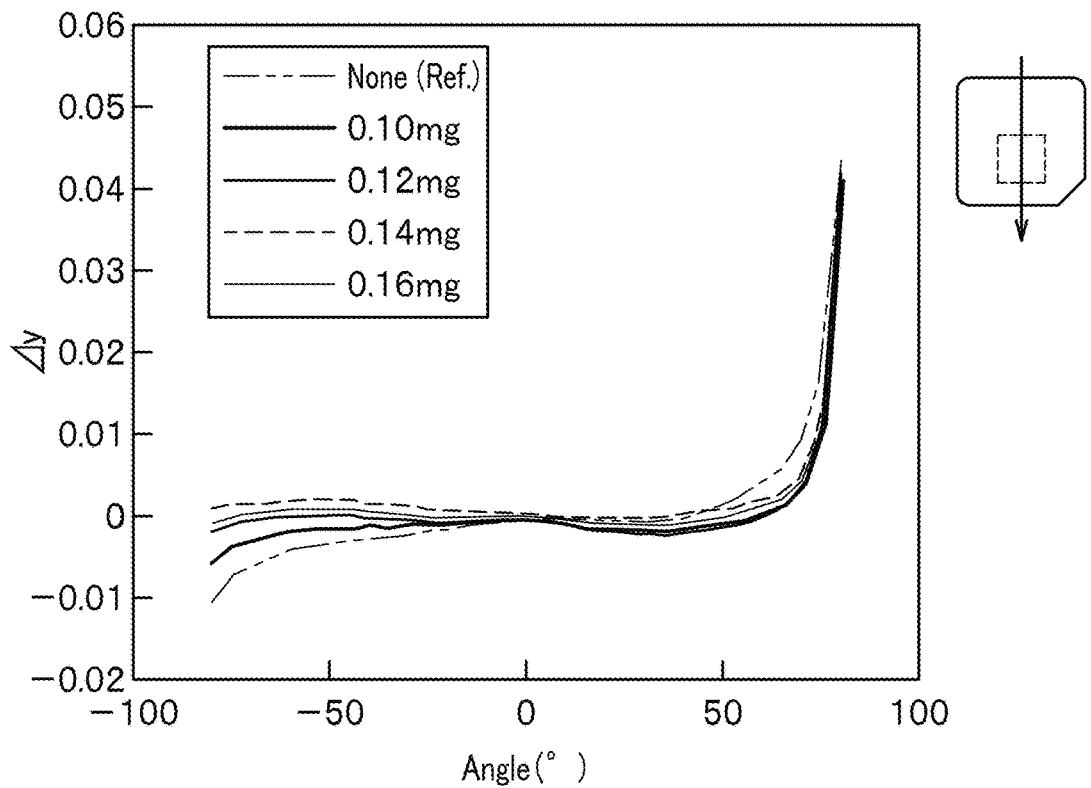
FIG. 7E is a graph showing y chromaticity coordinate deviations at certain directivity angles in Example 1.
Figure 8A:
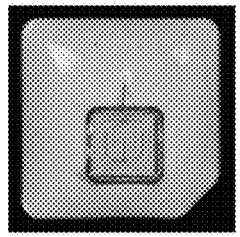
FIG. 8A is an image of the light emitting device of Example 2 showing the state after mounting a light emitting element and applying a second resin.
Figure 8B:
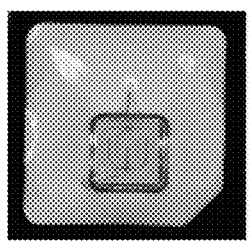
FIG. 8B is an image of the light emitting device of Example 2 showing the state after applying a first resin.
Figure 8C:
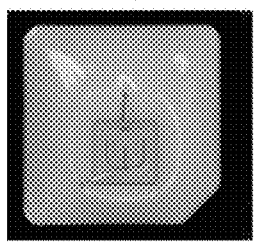
FIG. 8C is an image of the light emitting device of Example 2 showing the state after settling the reflecting material by applying centrifugal force to the first resin.
Figure 8D:
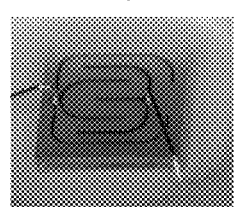
FIG. 8D is an image of the element's electrodes in the light emitting device of Example 2.
Figure 8E:
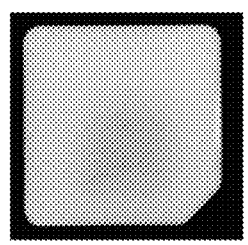
FIG. 8E is an image of the light emitting device of Example 2 showing the state after forming a light transmitting member.
Figure 9A:
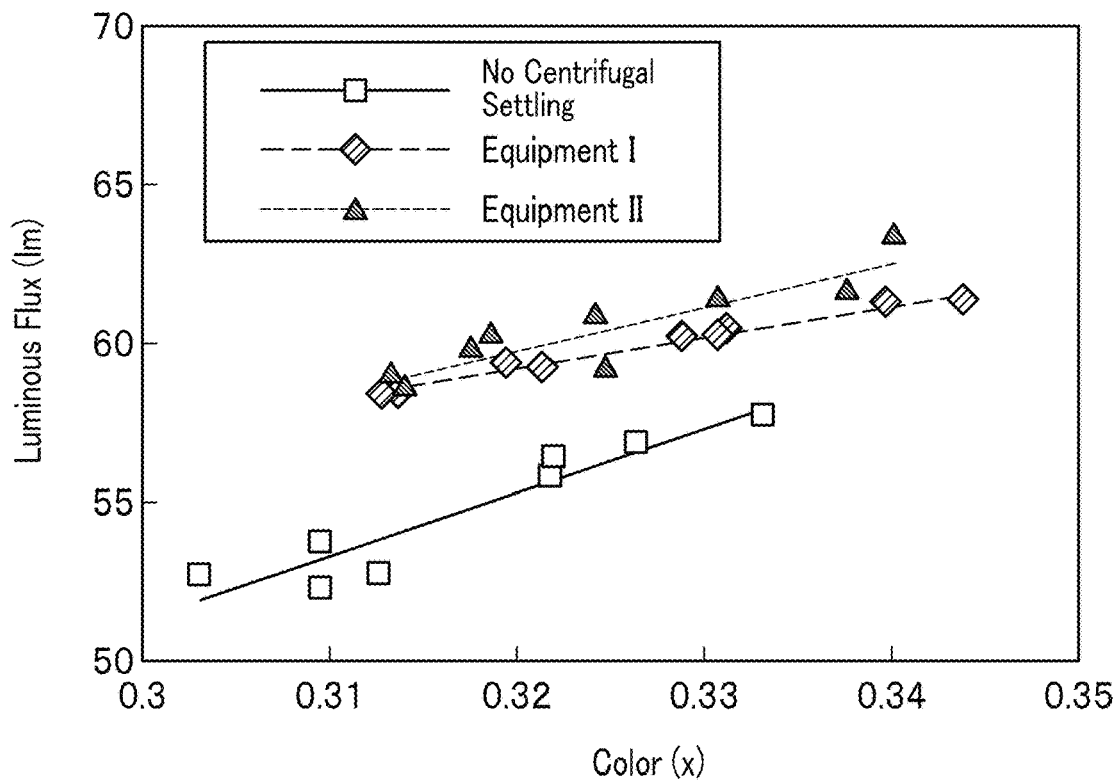
FIG. 9A is a graph showing the relationship between the chromaticity coordinate and the luminous flux in Example 2.
Figure 9B:
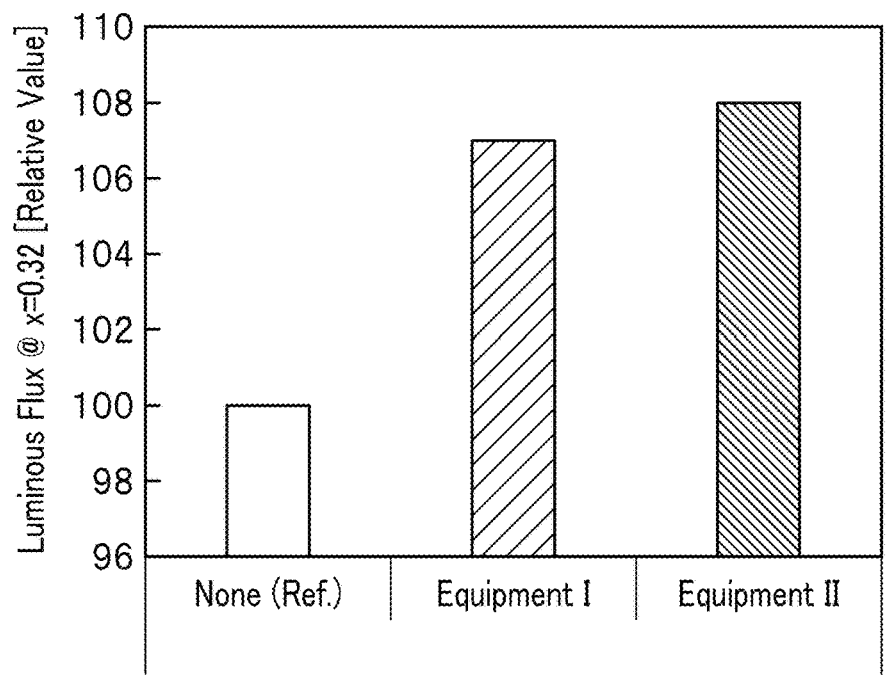
FIG. 9B is a graph showing the luminous flux of each sample in Example 2.

FIG. 6 shows images of the structures of the light emitting devices used in Example 1. FIG. 7A is a graph showing the relationship between the first resin applying amount and the luminous flux in Example 1. FIG. 7B is a graph showing x chromaticity coordinate deviations directivity angle directivity angles in Example 1. FIG. 7C is a graph showing y chromaticity coordinate deviations directivity angle directivity angles in Example 1. FIG. 7D is a graph showing x chromaticity coordinate deviations directivity angle directivity angles in Example 1. FIG. 7E is a graph showing y chromaticity coordinate deviations directivity angle directivity angles in Example 1. FIG. 8A is an image of a light emitting device of Example 2 showing the state after mounting a light emitting element and applying a second resin. FIG. 8B is an image of the light emitting device of Example 2 showing the state after applying a first resin. FIG. 8C is an image of the light emitting device of Example 2 showing the state after settling the reflecting material by applying centrifugal force to the first resin. FIG. 8D is an image of electrodes of the light emitting element in the light emitting device of Example 2. FIG. 8E is an image of the light emitting device of Example 2 showing the state after forming a light transmitting member. FIG. 9A is a graph showing the relationship between the chromaticity coordinate and the luminous flux in Example 2. FIG. 9B is a graph showing the luminous flux of each sample in Example 2.

Example 1

The light emitting devices structured as shown in FIG. 6 were produced. The light emitting devices having the structures shown in FIG. 6 were substantially the same except for varying the amount of the first resin applied. Packages each having a grooved part formed at the bottom surface of the recessed part were provided. In each package a first lead electrode and a second lead electrode were provided at the bottom surface of the recessed part, and the grooved part was formed in the first lead electrode. The lead electrodes were Au plated. The grooved part had a substantially semicircular cross section, 100 μm in width and 100 μm in depth.

Then a light emitting element was mounted on the bottom surface of the recessed part. Then a second cover member was formed using a second resin containing a second reflecting material to cover the bottom surface and the lateral surfaces of the recessed part. Then in each sample of Example 1, a first cover member was formed by supplying a first resin containing a first reflecting material the groove of the grooved part and hardening the resin after allowing the first reflecting material to settle by centrifugal settling. The applying amounts of the first resin were, as shown in FIG. 6 and FIGS. 7A to 7E, 0.10 mg, 0.12 mg, 0.14 mg, and 0.16 mg. Two points were used as the application positions D. The numerical values in the legends in FIGS. 7B to 7E represent the applying amounts of the first resin. The concentration of the first reflecting material contained in the first resin was 37.5 mass percentage. No first cover member was disposed in the comparative sample. Subsequently, a light transmitting member containing a phosphor was formed on the first cover member, the second cover member, and the light emitting element.

For the light emitting elements, nitride-based semiconductor elements having a peak emission wavelength of 442 nm were used. For the first reflecting material, titanium oxide having an average particle diameter of about 280 nm was used, and for the second reflecting material, titanium oxide having an average particle diameter of about 500 nm was used. For the phosphor, a YAG:Ce was used. For the first resin, a silicone resin having a resin viscosity of 3.5 Pa·s was used, for the second resin, a silicone resin having a resin viscosity of 1.0 Pa·s was used, and for the resin employed to form the light transmitting member, a silicone resin having a resin viscosity of 3.5 Pa·s similar to the first resin was used.

The luminous flux of each sample produced as above was measured at chromaticity coordinate of x=0.32. The luminous flux was measured by using a total luminous flux measurement system that utilizes an integrating sphere, and a relative luminous flux of each sample was calculated with the luminous flux of the comparative sample assumed as 100%. FIG. 7A shows the results. As shown in FIG. 7A, the samples having the first cover member in the groove of the grooved part exhibited higher luminous flux than the sample that did not have a first cover member in the groove of the grooved part. Moreover, as compared to those made by forming a first cover member without creating a grooved part, in the samples of Example 1, the first resin is less likely to flow towards the light emitting element before settling the first reflecting material. This can simplify manufacturing operations, and improve production efficiency.

As a reference, for each sample, x and y chromaticity coordinate deviations at certain directivity angles were measured. FIG. 7B and FIG. 7C show Δx and Δy, respectively, in the case of a directivity angle using the direction orthogonal to line IC-IC in FIG. 1A (0° direction) as a reference. FIG. 7D and FIG. 7E show Δx and Δy, respectively, in the case of a directivity angle using line IC-IC in FIG. 1A (90° direction) as a reference. In the present example, the light distribution chromaticity Δx and Δy represent the chromaticity coordinate deviations at certain directivity angles of the light emitting device using the chromaticity coordinates in the frontal direction as a reference. As shown in FIGS. 7B to 7E, no notable differences in the light distribution chromaticity Δx and Δy were found among the samples having a first cover member disposed in the groove of the grooved part as compared to the comparative sample.

In other words, in each sample of Example 1, because the reflecting material-containing layer is formed in the groove while exposing the lateral surfaces of the light emitting element substantially entirely, light extraction from the lateral surfaces of the light emitting element is not hindered. This can increase only the luminous flux with substantially no degradation of the light distribution chromaticity.

Example 2

Light emitting device samples were produced in accordance with the method used to manufacture the light emitting devices of Example 1. In Example 2, nine samples in which the first reflecting material was settled by centrifugal settling using equipment I at 700 rpm (rotation radius 0.65 m), and nine samples in which the first reflecting material was settled by using equipment II at 3000 rpm (rotation radius 0.1 m) were produced. The applying amount of the first resin was 0.09 mg in each sample. As comparative samples, nine samples that had no first cover member in the groove of the grooved part (no centrifugal settling) were produced. FIGS. 8A to 8E are images of a sample made by using equipment I taken after each manufacturing process.

For each sample, the relationship between the color and the luminous flux was investigated. The luminous flux was measured by using a total luminous flux measurement system using an integrating sphere at room temperature of about 25° C. FIG. 9A shows the results. From the results shown in FIG. 9A, the luminous flux at chromaticity coordinate of x=0.32 was calculated. FIG. 9B shows the results. As shown in FIG. 9B, the samples having a first cover member disposed in the groove of the grooved part exhibited higher luminous flux as compared to the samples having no first cover member in the groove of the grooved part. Moreover, the samples made by using equipment II having a higher centrifugal force than equipment I exhibited higher luminous flux.

Light emitting devices according to embodiments of the present disclosure can be utilized as backlight light sources for liquid crystal displays, in various lighting fixtures, large displays, various display devices such as billboards and destination signs, image readers used in devices, such as digital video cameras, facsimiles, copiers, and scanners, and projectors.

What is claimed is:

1. A method of manufacturing a light emitting device that comprises a first cover member and a second cover member, the method comprising:
   providing a package that comprises a substrate, a plurality of resin walls, and a recessed part defined by an upper surface of the substrate and lateral surfaces of the plurality of resin walls, wherein the substrate includes a grooved part surrounding a first region;
   mounting a light emitting element in the first region;
   forming the second cover member in a region between the lateral surfaces defining the recessed part to an upper edge of an outer perimeter of the grooved part;
   forming the first cover member, which comprises depositing an uncured resin on the second cover member, and allowing the uncured resin to flow into a groove of the grooved part and contact a first portion of lateral surfaces of the light emitting part; and
   forming a light transmitting member on the first cover member and the light emitting element such that the light transmitting member directly contacts a second portion of the lateral surfaces of the light emitting element.

2. The method according to claim 1, wherein the uncured resin contains a reflecting material, and the formed first cover member comprises:
   a reflecting material-containing layer formed in the groove of the grooved part by settling the reflecting material in the uncured resin, and
   a light transmitting layer that directly contacts the first portion of the lateral surfaces of the light emitting element.

3. The method according to claim 2, further comprising, before forming the first cover member, forming the uncured resin, which comprises mixing a base agent of a two-part hardening type resin material and the reflecting material to form a mixture, and after the passage of at least two hours, mixing a hardening agent into the mixture to form the uncured resin.

4. The method according to claim 1, wherein the second cover member covers an entirety of the region between the lateral surfaces defining the recessed part to the upper edge of the outer perimeter of the grooved part.

5. The method according to claim 1, wherein, in the step of forming the first cover member, the uncured resin is caused to flow into the groove of the grooved part and contact the first portion of lateral surfaces of the light emitting part by applying centrifugal force to the package and the uncured resin.

6. The method according to claim 5, wherein the step of forming the first cover member comprises hardening the uncured resin under the centrifugal force.

7. The method according to claim 6, wherein a temperature used for hardening the first resin is in a range of 40° C. to 200° C.

8. The method according to claim 1, wherein a viscosity of the uncured resin is in a range of 0.3 Pa·s to 15 Pa·s.

9. The method according to claim 1, wherein the light transmitting member contains a wavelength conversion material.

10. The method according to claim 1, wherein a width of the grooved part is in a range of 30 μm to 200 μm.

11. The method according to claim 1, wherein a depth of the grooved part is in a range of 10 μm to 150 μm.

12. The method according to claim 1, wherein the grooved part is formed at a position that is 100 μm or less from the light emitting element.

13. The method according to claim 1, wherein, after the step of forming the first cover member, the first cover member directly contacts an upper surface of the second cover member.

14. The method according to claim 13, wherein, after the step of forming the first cover member, the upper surface of the second cover member is inclined so as to extend upward and outward from the upper edge of the outer perimeter of the grooved part.

15. The method according to claim 1, wherein, after the step of forming the first cover member, an upper surface of the first covering member is inclined so as to extend downward and outward from the first portion of the lateral surfaces of the light emitting element.

16. The method according to claim 1, wherein the substrate comprises a first lead electrode, a second lead electrode, and a resin molded part that supports the first lead electrode and the second lead electrode.

17. The method according to claim 16, wherein the plurality of resin walls and the resin molded part of the substrate are integrally formed.

18. The method according to claim 16, wherein the grooved part is located at an upper surface of the first lead electrode.

19. The method according to claim 18, wherein:
   wherein the light emitting element is mounted on the first lead electrode; and
   the method further comprises mounting a protective device on the second lead electrode.

20. The method according to claim 1, wherein, in the step of mounting the light emitting element, the light emitting element is mounted so as to be offset from a center of the substrate.

* * * * *